(12) United States Patent
Iwane et al.

(10) Patent No.: US 8,129,996 B2
(45) Date of Patent: Mar. 6, 2012

(54) METHOD AND APPARATUS FOR DETERMINING DETERIORATION OF SECONDARY BATTERY, AND POWER SUPPLY SYSTEM THEREWITH

(75) Inventors: Noriyasu Iwane, Tokyo (JP); Yuichi Watanabe, Tokyo (JP); Fumikazu Iwahana, Tokyo (JP); Atsushi Kimura, Tokyo (JP); Toshiyuki Sato, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/605,930

(22) Filed: Oct. 26, 2009

(65) Prior Publication Data

US 2010/0045298 A1    Feb. 25, 2010

Related U.S. Application Data

(60) Division of application No. 12/049,907, filed on Mar. 17, 2008, now Pat. No. 7,626,394, which is a continuation of application No. PCT/JP2006/318145, filed on Sep. 13, 2006.

(30) Foreign Application Priority Data

Sep. 16, 2005  (JP) .................. 2005-270917
Oct. 14, 2005  (JP) .................. 2005-300333
Jan. 16, 2006  (JP) .................. 2006-007980

(51) Int. Cl.
   *G01N 27/416* (2006.01)
(52) U.S. Cl. ................................... 324/427
(58) Field of Classification Search ............ 324/427
See application file for complete search history.

(56) References Cited

U.S. PATENT DOCUMENTS

| 5,539,318 | A  |   | 7/1996  | Sasaki |
| 6,366,054 | B1 |   | 4/2002  | Hoenig et al. |
| 6,512,984 | B1 | * | 1/2003  | Suzuki et al. ............. 702/63 |
| 6,856,866 | B2 |   | 2/2005  | Nakao |
| 6,876,174 | B1 | * | 4/2005  | Samittier Marti et al. .... 320/132 |
| 6,885,951 | B2 | * | 4/2005  | Richter .................... 702/63 |
| 7,072,871 | B1 |   | 7/2006  | Tinnemeyer |
| 7,295,014 | B2 |   | 11/2007 | Koch et al. |

(Continued)

FOREIGN PATENT DOCUMENTS

JP    H01-253177    10/1989

(Continued)

*Primary Examiner* — M'Baye Diao
(74) *Attorney, Agent, or Firm* — Oblon, Spivak, McClelland, Maier & Neustadt, L.L.P.

(57) ABSTRACT

A method for detecting SOC and SOH of a storage battery includes: calculating an SOC value of the storage battery with use of an SOC calculation unit based on a measured voltage value or a measured current value of the storage battery and calculating an SOH value of the storage battery with use of an SOH calculation unit based on the SOC value; further calculating a new SOC value with use of the SOC calculation unit based on the SOH value and calculating a new SOH value with use of the SOH calculation unit based on the new SOC value, these further calculations of SOC value and SOH value being repeated a prescribed n times of at least one so as to obtain an nth calculated SOC value and an nth calculated SOH value; outputting the nth calculated SOH value as an SOH output value and outputting the nth calculated SOH value as an SOC output value; and storing the SOH output value into a memory.

14 Claims, 15 Drawing Sheets

U.S. PATENT DOCUMENTS

| | | | |
|---|---|---|---|
| 7,593,823 B2 * | 9/2009 | Iwane et al. | 702/63 |
| 2002/0030494 A1 * | 3/2002 | Araki et al. | 324/427 |
| 2003/0074335 A1 | 4/2003 | Singh et al. | |
| 2004/0024546 A1 | 2/2004 | Richter | |
| 2005/0057255 A1 | 3/2005 | Tate et al. | |
| 2006/0170397 A1 | 8/2006 | Srinivasan et al. | |
| 2006/0186890 A1 | 8/2006 | Iwane et al. | |
| 2006/0208704 A1 | 9/2006 | Iwane et al. | |
| 2007/0252601 A1 | 11/2007 | Satoh et al. | |
| 2007/0285098 A1 | 12/2007 | Ehret et al. | |
| 2008/0120050 A1 | 5/2008 | Iwane et al. | |
| 2008/0136378 A1 | 6/2008 | Iwahana et al. | |

FOREIGN PATENT DOCUMENTS

| | | |
|---|---|---|
| JP | 4-43975 | 2/1992 |
| JP | H05-281309 | 10/1993 |
| JP | 6-59003 | 3/1994 |
| JP | 11-38107 | 2/1999 |
| JP | 2000-121710 | 4/2000 |
| JP | 2000-166109 | 6/2000 |
| JP | 2000-258513 | 9/2000 |
| JP | 2001-228226 | 8/2001 |
| JP | 2004-530880 | 10/2004 |
| JP | 2005-91217 | 4/2005 |

* cited by examiner

US 8,129,996 B2

METHOD AND APPARATUS FOR DETERMINING DETERIORATION OF SECONDARY BATTERY, AND POWER SUPPLY SYSTEM THEREWITH

CROSS-REFERENCE TO RELATED APPLICATIONS

This application is a divisional of and claims the benefit of priority under 35 U.S.C. §120 from U.S. application Ser. No. 12/049,907, filed Mar. 17, 2008, the entire contents of which are incorporated herein by reference. U.S. application Ser. No. 12/049,907 is in turn a "bypass" continuation of PCT/JP2006/318145 filed Sep. 13, 2006, to which the present application also claims priority. PCT/JP2006/318145 in turn claims the benefit of priority to Japanese applications JP 2005-270917 filed Sep. 16, 2005, JP 2005-300333 filed Oct. 14, 2005, and JP 2006-007980 filed Jan. 16, 2006, the entire contents of each of which are incorporated herein by reference, and from each of which the present application also claims the benefit of priority.

TECHNICAL FIELD

The present invention relates to a method for determining a state of health (SOH) of a secondary battery supplying power to a load. More particularly, the present invention relates to a method for determining the SOH of a secondary battery based on an estimation result of an internal impedance or an internal resistance of the secondary battery.

BACKGROUND ART

As a method for detecting a state of charge (SOC) of a storage battery, for example, as described in Japanese Unexamined Patent Application Publication No. 2004-530880, there is a method for estimating SOC by measuring the battery voltage with using the relation (linearity) between a battery voltage and SOC.

In this method, it is not possible to measure a stabilized battery voltage because the battery voltage is greatly affected by the over-voltage due to charge or discharge. Particularly, in the vehicle, the storage battery supplies a power to each load during and after engine start and is charged by a charger as well, thereby being charged and discharged repeatedly. Accordingly, the stabilized battery voltage can not be obtained, resulting in generation of significant errors in estimation of the SOC obtained from the linearity.

Therefore, for a storage battery mounted on the vehicle, particularly, a storage battery supplying a power to a load only at emergency without regularly being connected to the load, there is a method for estimating SOC by substituting a measured data of battery voltage into a linear expression after measuring the battery voltage during the period between an door-open and engine startup, or a method for estimating SOC by periodically detecting battery voltages for long hours with a timer to obtain stabilized voltage values. The methods described above are lack of accuracy, because the methods utilize the measured raw data for the estimation and there is no consideration of, for example, a state of health (SOH).

Besides, methods for estimating an SOC of a storage battery during being charged includes a method in which a charged amount is calculated by multiplying the current value by hour, followed by comparing the charged amount with battery capacity and normalizing data.

However, the battery capacity of the storage battery is lowered and decreased from its initial capacity in accordance with the deterioration of the storage battery, thus the accuracy of the calculated SOC becomes lower than that of the initial stage associated with the deterioration. Specially, this tendency appears outstandingly in the case when an SOC is low due to, for example, the discharge of the battery. As measures against this problem, there has been known methods for correcting a battery capacity based on the deterioration level as described in Japanese Patent Application Publications No. H6-59003 and No. 2000-166109.

The methods for correcting a battery capacity based on a deterioration level described in Japanese Patent Application Publications No. H6-59003 and No. 2000-166109 include: estimating a residual charge at the full charged (SOC: 100%) based on the residual charge at heavy loaded obtained by using the IV method which calculates the relation between the discharge current of the storage battery and the battery voltage at every SOC; calculating a deterioration level by dividing the residual charge by the battery capacity; and correcting the battery capacity in accordance with the deterioration level.

These methods also use only the SOC at the time when measured to determine an SOC and thus lack the accuracy of the determination.

There are methods for detecting an SOH such as a method for detecting an SOH based on an increase of an internal resistance of a battery, a method for detecting an SOH from a voltage when a storage battery is discharged, and a method for detecting an SOH by estimating a capacity of a storage battery from a voltage when the battery is discharged. Any of the methods use only an SOH at the time when measured without consideration of factors, like temperature or other and thus lack the accuracy of the determination of an SOH.

Technology for determining an SOH of a secondary battery such as a lead battery mounted on the vehicle and the like is described in Japanese Patent Application Publication No. 2001-228226.

Generally, since there is a strong correlation between an internal impedance or an internal resistance and an SOH of a secondary battery, if an internal impedance or an internal resistance of a secondary battery can be obtained, it is possible to determine a deterioration level of the secondary battery from the obtained result. This makes it possible to inform the user of the need for replacing the deteriorated battery.

In order to determine an SOH of the secondary battery in a power supply system having a secondary battery, it may be employed a construction in which the secondary battery is charged or discharged with a specified current, a current and a voltage at that time are measured, and an internal impedance or an internal resistance is calculated from the measured current and voltage by using a specified operation.

In the case when a secondary battery is mounted on the vehicle and the like, it is important that normal operation of the secondary battery be guaranteed over a very wide range of operating temperature in supposing the usage in various areas and environments.

Meanwhile, the internal impedance or internal resistance of the secondary battery has a tendency to be changed a great deal depending on temperature and to be significantly increased specially at low temperature. Accordingly, even if the internal impedance or internal resistance falls within the allowable range at normal temperature, they may be out of the allowable range at lower temperature, and thus it may not be able to use the secondary battery under the lower temperature.

Consequently, it becomes important to accurately determine the SOH regardless of the operating temperature of the second battery, thus it is required that the internal impedance or internal resistance should be estimated after temperature correction by means of any method. The internal impedance or internal resistance of the secondary battery has a complicated temperature characteristic, so it is difficult to make an accurate approximation with a simple approximate formula, and it has been difficult to make temperature correction for the internal impedance or internal resistance with high accuracy.

Japanese Patent Application Publication No. 2005-091217 discloses the related technology for determining SOH of a secondary battery with high accuracy by correcting a temperature characteristic of an internal impedance with use of a polynomial expression of at least the third or more degree.

Generally, the impedance of the battery has a strong correlation with the deterioration level or discharge capability of the battery, thus, if the impedance of the battery can be obtained, the deterioration level or discharge capability of the battery can be estimated by the obtained impedance. This makes it possible to inform the user of the need for replacing the deteriorated battery or the battery having lowered discharge capability.

In order to estimate a deterioration level or discharge capability of a secondary battery in a power supply system having the secondary battery, there has been conventionally known a method which includes: letting a specified charge current or discharge current flow to the battery; measuring the current and the voltage at the time; and calculating the internal impedance by a specified operation from the measured current and voltage.

The impedance of the battery can be an index for showing an accurate deterioration level or discharge capability of the battery if measurements are carried out under the same conditions. However, in the case where the impedance measurement is applied to a practical system, specially to the vehicle as a typical example, a charge current and a discharge current such as a charge current regularly flowing from an alternator to the battery and a discharge current to be supplied to each electric device flow through the battery mounted on the vehicle during a normal operation.

Thus, the impedance measurement has been performed in the state that the charge current and the discharge current during the normal operation are superimposed with or added to the specified charge current or the discharge current described above, without considering the difference of the measuring condition due to the superimposed charge/discharge current.

DISCLOSURE OF THE INVENTION

Problems to be Solved by the Invention

Charge capability and discharge capability of the storage battery vary depending largely on conditions and states thereof. The conditions and states include variation of SOC and deterioration of the storage battery. The charge amount in the storage battery, which is the basis for calculating the SOC, varies in accordance with the temperature change of the environments and the condition and state of charging or discharging.

Since the SOC is regularly prescribed by the discharge capability and the discharge characteristics during the time when a long-hour discharge is performed, the deterioration of the storage battery inevitably affects the calculation of the SOC. On the other hand, when calculating the SOH, depending on the definition thereof, the SOH calculation is not a little affected by an SOC. Accordingly, the SOC and the SOH have been corrected in some way. The conventional detection methods includes, for example, a method in which the correction is made based on the deterioration level when calculating the SOC, and a method in which the correction is made based on an SOC when calculating an SOH. That is, conditioning factor for correcting the SOC and SOH is independently considered in each detection method. Thus, the difference in accuracy between the SOH detection and the SOC detection may be caused, making it difficult to optimally manage the storage battery.

The above-described conventional methods for determining a deterioration of a secondary battery have problems as described hereinafter. A current and a voltage are measured at the time when the secondary battery is charged or discharged with a specified current to calculate an internal impedance. In the case where the specified current is a low frequency AC (Alternative Current) of 20 Hz or less, the method according to the Japanese Patent Application Publication No. 2005-091217 can determine the deterioration of the secondary battery.

However, there has been a problem that noise is not negligible in the case where the specified current is the low frequency AC of 20 Hz or less. In other words, since an alternator may be used to charge the secondary battery with the specified current, the noise from the alternator is not negligible in the case of the low frequency AC of 20 Hz or less. Further, the noise from a load affects the measurement when the specified current is discharged.

Accordingly, it is required that the AC of 100 Hz or higher frequency is used as the specified current, so as to prevent the influence of the noise from the alternator or the load. Besides, in the case where a pulse DC (Direct Current) is used for the specified current, it is necessary to use the current value and voltage value measured within 10 ms of starting the pulse current input for the calculation of the internal impedance thereof.

However, in the case where the AC of 100 Hz or higher frequency or the response within 10 ms of starting the pulse current input is used as the specified current, the method for determining a deterioration of a secondary battery described in Japanese Patent Application Publication No. 2005-091217 has been not able to determine a deterioration of a secondary battery with sufficient accuracy.

Furthermore, the above-described conventional method for estimating a deterioration level or a discharge capability of a secondary battery has a problem as follows. Specifically, there has been known that the impedance of the battery depends on magnitude each of a charge current and a discharge current in the normal operation described above, and it is difficult to estimate an accurate deterioration and discharge capability under such environment.

One object of the present invention is to provide a method and apparatus for detecting SOC and SOH of a storage battery capable of performing an optimum management by detecting both the SOC and the SOH accurately at the same level. Another object of the present invention is to provide a method for determining SOH of a secondary battery capable of determining the SOH of the secondary battery with high accuracy by accurately correcting a change of internal impedance or internal resistance due to the operating temperature of the secondary battery. Still another object of the present invention is to provide a method for estimating a deterioration level or a discharge capability of a battery, by estimating am impedance at a reference direct current value, with the influence of the impedance due to a charge current and a discharge current that is superimposed in normal operation being eliminated.

Means for Solving the Problems

A first aspect of the present invention to resolve the problems is a method for detecting SOC and SOH of a storage battery which includes: calculating an SOC value of the storage battery with use of an SOC calculation unit based on a measured voltage value or a measured current value of the storage battery and calculating an SOH value of the storage battery with use of an SOH calculation unit based on the SOC value;

further calculating a new SOC value with use of the SOC calculation unit based on the SOH value and calculating a new SOH value with use of the SOH calculation unit based on the new SOC value, these further calculations of SOC value and SOH value being repeated a prescribed n times of at least one so as to obtain an nth calculated SOC value and an nth calculated SOH value;

outputting the nth calculated SOH value as an SOH output value and outputting the nth calculated SOC value as an SOC output value; and storing the SOH output value into a memory.

A second aspect of the present invention is a method of the first aspect, in which the SOC output value is also stored in the memory.

A third aspect of the present invention is a method of the first or second aspect, in which the SOC calculation is repeated until the new SOH value converges to a specified range.

A fourth aspect of the present invention is a method of any one of the first to third aspects, in which a first calculated SOC value firstly obtained with use of the SOC calculation unit is obtained by correcting the measured voltage value or the measured current value based on either one of an initial SOH value set in advance and a previous SOH output value lastly stored in the memory.

A fifth aspect of the present invention is a method of any one of the first to third aspects, in which the SOH calculation unit calculates the SOH value by correcting a measured internal impedance value of the storage battery based on the SOC value.

A sixth aspect of the present invention is a method of the fifth aspect, in which the measured internal impedance value at a measurement temperature of the storage battery is corrected to a internal impedance value at a specified temperature.

A seventh aspect of the present invention is a method of any one of the first to sixth aspects, in which the SOC calculation unit calculates the SOC value by substituting one of: a measured value of an open-circuit voltage (OCV) of the storage battery; and a corrected value obtained by correcting the measured value of the OCV based on an initial SOH value or a newest SOH value, into a functional expression.

A eighth aspect of the present invention is a method of any one of the first to fifth aspects, in which the SOC calculation unit calculates a change in the SOC value based on a discharge current or a charge current of the storage battery, corrects the change in the SOC value in accordance with SOH value, and adds the corrected change in the SOC value to the SOC value obtained in the previous calculation so as to calculate the new SOC value.

A ninth aspect of the present invention is a method of any one of the first to eighth aspects, in which, when the SOH output values in the memory three times or more are stored, a slope of the change of the SOH output values with respect to a number of the storing is determined, and if the last stored SOH output value falls within an allowable range, the last stored SOH output value stored in the memory is decided as a true value, while if the last stored SOH output value is out of the allowable range, the last stored SOH output value is deleted from the memory, and then, a new SOC output value and a new SOH output value are determined through the measurement and/or calculation.

A tenth aspect of the present invention is a method of any one of the first to eighth aspects, in which, when the SOH output values in the memory three times or more are stored, a slope of the change of the SOH output values with respect to a number of the storing is determined, and if the last stored SOH output value is out of the allowable range, an alert is issued.

A eleventh aspect of the present invention is an apparatus for detecting SOC and SOH of a storage battery which includes: an SOC calculation unit configured to: execute a first calculation of an SOC value of the storage battery based on a measured voltage value or a measured current value of the storage battery; execute a second calculation of an SOC value by correcting the measured voltage value or the measured current value of the storage battery in accordance with an SOH value of the storage battery; repeat the second calculation a prescribed n times of at least two; and output an nth calculated SOC value as an SOC output value;

an SOH calculation unit configured to: repeatedly calculate an SOH value of the storage battery based on the calculated SOC value the prescribed n times corresponding to a repeat number of the SOC calculation; and output an nth calculated SOH value as an SOH output value; and a memory for storing at least a plurality of the SOH output values among the SOH and SOC output values, respectively obtained in the nth calculation.

A twelfth aspect of the present invention is an apparatus of the eleventh aspect, which further includes a control unit configured to: determine a slope of a change of the SOH output values with respect to a number of the storing times in the memory when the SOH output value is stored in the memory three times or more; decide a newest SOH output value as a true value if the newest stored SOH output value of the stored values falls within an allowable range; and delete the newest SOH output value and obtain again an SOC output value and an SOH output value through the measurement and/or the calculation if the newest SOH output value is out of the allowable range.

A thirteenth aspect of the present invention is a method for determining SOH of a secondary battery according to an internal impedance or an internal resistance of the secondary battery supplying power to a load, which includes: preparing in advance a specified temperature characteristic function which contains at least one exponential terms and one adjustment parameter and expresses a temperature dependency of the internal impedance or the internal resistance; calculating the internal impedance or the internal resistance based on a measured current value or a measured voltage value at the time when the secondary battery is charged or discharged with a specified current; determining a value of the adjustment parameter by substituting the measured temperature at the time when the secondary battery is charged or discharged with the specified current and the calculated internal impedance or the internal resistance to the temperature characteristic function; calculating a reference internal impedance or a reference internal resistance by substituting the determined adjustment parameter value and a specified reference temperature into the temperature characteristic function; and determining the SOH of the secondary battery based on the calculated reference internal impedance or the calculated reference internal resistance.

A fourteenth aspect of the present invention is a method for determining an SOH of a storage battery in which the temperature characteristic function is expressed by:

$$Z(\text{Temp}) \text{ or } R(\text{Temp}) = f(C) \times \exp\{g(C)/\text{Temp}\} + C$$

where Z is the internal impedance, R is the internal resistance, C is the adjustment parameter, and f and g express a specified function respectively.

A fifteen aspect of the present invention is a method of the thirteenth or fourteenth aspect, which further includes: setting in advance a first threshold for determining the SOH based on the reference internal impedance and a second threshold for determining the SOH based on the reference internal resistance, respectively; comparing the reference internal impedance with the first threshold when the reference internal impedance was calculated, and comparing the reference internal resistance with the second threshold when the reference internal resistance was calculated; and determining the SOH of the secondary battery based on either of two comparison results.

A sixteenth aspect of the present invention is a method of any one of the thirteenth to fifteenth aspect, in which the internal impedance is calculated based on the measured current value and the measured voltage value at the time when the secondary battery is charged or discharged at an AC of 100 Hz or more frequency as the specified current.

A seventeenth aspect of the present invention is a method of any one of the thirteenth to fifteenth aspects, in which the secondary battery is charged or discharged with a pulse current as the specified current, and the internal resistance is calculated based on measured values of the current and voltage measured within 10 ms of starting the charge or discharge.

A eighteenth aspect of the present invention is an apparatus for determining an SOH of a secondary battery based on an internal impedance or an internal resistance of the secondary battery supplying power to a load, which includes: a charging circuit for charging the secondary battery with a specified current; a discharging circuit for discharging the secondary battery with a specified current; a current sensor for measuring a current of the secondary battery; a voltage sensor for measuring a voltage of the secondary battery; a temperature sensor for measuring a temperature of the secondary battery; and a control unit for (i) receiving a measured current value, a measured voltage value, and a measured temperature value from the current sensor, the voltage sensor, and the temperature sensor, respectively, at the time when the secondary battery is charged or discharged with the specified current by the charging circuit or the discharging circuit, (ii) calculating the internal impedance or the internal resistance based on the measured current value and the measured voltage value, (iii) determining a value of a adjustment parameter by substituting the calculated internal impedance or the calculated internal resistance and the measured temperature into a temperature characteristic function which contains at least one exponential terms and one adjustment parameter and expresses a temperature dependency of the internal impedance or the internal resistance, (iv) calculating a reference internal impedance or a reference internal resistance by substituting the decided adjustment parameter value and a specified reference temperature into the temperature characteristic function, and (v) determining an SOH of the secondary battery based on the calculated reference internal impedance or the calculated reference internal resistance.

A nineteenth aspect of the present invention is an apparatus of the eighteenth aspect, which further includes: a storage unit storing in advance a first threshold for determining deterioration based on the reference internal impedance, and a second threshold for determining deterioration based on the reference internal resistance, wherein the control unit compares the reference internal impedance and the first threshold read out from the storage unit when the reference internal impedance was calculated, compares the reference internal resistance and the second threshold read out from the storage unit when the reference internal resistance was calculated, and determines the SOH of the secondary battery based on either of two comparison results.

A twentieth aspect of the present invention is an apparatus of the nineteenth aspect, in which the storage unit stores a charge or discharge selection signal to select either the charge or the discharge of the secondary battery with the specified current, and the control unit reads the charge or discharge selection signal from the storage unit and outputs a specified instruction signal to the charging circuit or the discharging circuit based on the charge or discharge selection signal.

A twenty-first aspect of the present invention is an apparatus of the nineteenth or twentieth aspect, in which the storage unit stores a DC or AC selection signal to designate either an AC of 100 Hz or more frequency or a pulse current as the specified current, and the control unit reads the DC or AC selection signal from the storage unit and selects either the AC of 100 Hz or more frequency or the pulse current in accordance with the DC or AC selection signal so as to output a specified control signal to the charging circuit or the discharging circuit.

A twenty-second aspect of the present invention is an apparatus of the twenty-first aspect, in which the storage unit stores at least one of a frequency of the AC and a pulse width of the pulse current, and the control unit reads at least one of the frequency of the AC and the pulse width of the pulse current from the storage unit and sets at least one of the frequency of the AC and the pulse width of the pulse current in the charging circuit or the discharging circuit at the same time as or prior to the output of the specified control signal for the charging circuit or the discharging circuit.

A twenty-third aspect of the present invention is a power supply system, which includes the apparatus for determining an SOH of a secondary battery of any one of the eighteenth to twenty-third aspects.

A twenty-fourth aspect of the present invention is a power supply system of the twenty-third aspect, which further includes a display unit for display a determination result of the SOH of the secondary battery by receiving the result from the apparatus for determining an SOH of a secondary battery.

A twenty-fifth aspect of the present invention is a power supply system of the twenty-third or twenty-fourth aspect, which further includes an input unit for changing data stored in the storage unit, wherein at least one or all of the first threshold for the determination, the second threshold for the determination, the charge or discharge selection signal, the DC or AC selection signal, the frequency of the AC, and the pulse width of the pulse current can be changed with the input unit.

A twenty-sixth aspect of the present invention is a method for estimating a deterioration level or a discharge capability of a battery by comparing an impedance of the battery with a predetermined allowable range thereof, the method including: measuring a current and a voltage of the battery; calculating an impedance Za of the battery from the measured current value and the measured voltage value and calculating a superimposed DC component IDCa from the measured current value; and estimating an impedance Zb of the case when a reference direct current IDCb value is superimposed, from the calculated impedance Za value and the calculated superimposed DC component IDCa value, based on a predetermined relational expression between a superimposed direct current IDC and a impedance Z so as to determine the deterioration level or a discharge capability of the battery.

A twenty-seventh aspect of the present invention is a method of the twenty-sixth aspect, in which, in the relational expression between the superimposed direct current IDC and the impedance Z, the impedance Z is expressed by a function including at least one exponential term of the superimposed direct current IDC.

A twenty-eighth aspect of the present invention is a method of twenty-seventh aspect, in which the relational expression between the superimposed direct current IDC and the impedance Z is expressed by:

$$Z = a1 \times \exp(-IDC/b1) + a2 \times \exp(-IDC/b2) + \ldots + c.$$

A twenty-ninth aspect of the present invention is a method of twenty-eighth aspect, in which the coefficients a1, a2, b1, b2, ... of the relational expression between the superimposed direct current IDC and the impedance Z are given by functions $f1(c)$, $f2(c)$, ..., $g1(c)$, $g2(c)$, ..., of one adjustment parameter c, respectively.

A thirtieth aspect of the present invention is method of twenty-ninth aspect, in which a value of the adjustment parameter c is determined so that, when substituting the calculated superimposed DC component IDCa value into the direct current IDC of the relational expression, the impedance Z of the relational expression agrees with the calculated impedance Za.

A thirty-first aspect of the present invention is a method of the twenty-ninth or thirtieth aspect, in which the functions $f1(c)$, $f2(c)$, ..., $g1(c)$, $g2(c)$, ... of the adjustment parameter c are respectively expressed by linear function of c.

A thirty-second aspect of the present invention is a method of any one of the twenty-sixth to thirty-first aspects, in which the calculated superimposed DC component IDCa value is obtained by performing any of moving average operation, Fourier transfer operation, and Kalman filter operation on the measured current value.

A thirty-third aspect of the present invention is an apparatus for estimating a deterioration level or a charge capability of a battery based on an impedance of the battery, which includes: a current sensor for measuring a current of the battery; a voltage sensor for measuring a voltage of the battery; and a control unit for (i) receiving a measured current value and a measured voltage value from the current sensor and the voltage sensor, respectively, (ii) calculating a impedance Za of the battery from the measured current value and the measured voltage value and calculating a superimposed DC component IDCa from the measured current value, (iii) estimating an impedance Zb of the case when a reference direct current IDCb value is superimposed, from the calculated impedance Za value and the calculated superimposed DC component IDCa value, based on a predetermined relational expression between a superimposed direct current IDC and a impedance Z so as to determine the deterioration level or a discharge capability of the battery.

A thirty-fourth aspect of the present invention is a power supply system, which includes the apparatus for estimating the deterioration level or the discharge capability of the battery or the thirty-third aspect.

According to the present invention, when the detections of SOC and SOH are performed, the detections being interactive each other are set at the same level, and the each other's data during the detections are repeatedly obtained from each other and corrected by each other, whereby the SOC and SOH are finally determined.

Besides, by storing the SOH in the memory, a detection error of each SOC and SOH and an abnormal detection can be detected by comparing the detected values with the latest value or the value before the latest, etc., making it possible to conduct an appropriate management of the storage battery.

According to the present invention, the SOH of the secondary battery is determined by correcting the temperature dependency of the internal impedance or the internal resistance of the secondary battery by using a temperature characteristic function containing at least one exponential terms and by estimating the reference internal impedance or the reference internal resistance at the predetermined reference temperature, making it possible to determine the SOH accurately and correctly, regardless of the operating temperature.

In addition, the adjustment parameter of the temperature characteristic function is determined based on the measured current value, the measured voltage value, and the measured temperature value of the secondary battery, making it possible to determine the SOH of the secondary battery with high accuracy, corresponding to a change of temperature characteristics due to the battery deterioration caused by aging, and the like.

According to the present invention, it becomes possible to provide the method and apparatus for estimating the deterioration level or the discharge capability of the battery based on the estimation result of the impedance Zb at the reference direct current IDCb value and the power supply system therewith, with the influences of the charge/discharge current during the normal operation to the impedance being eliminated.

More specifically, the impedance Zb at the reference direct current IDCb value is obtained from the impedance Za and the DC component IDCa at the time of measurement, and the impedance Zb is compared with the allowable impedance value, thus the deterioration level or the discharge capability of the battery can be determined at the same condition of the fixed DC value. As a result, it becomes possible to accurately determine the deterioration level or the discharge capability of the battery.

Besides, since the relational expression between the superimposed direct current IDC and the impedance Z, which is required for obtaining the impedance Zb at the reference direct current IDCb value based on the impedance Za and the DC component IDCa at the time of measurement, includes at least one exponential term of the direct current IDC, it becomes possible to determine the deterioration level or the discharge capability of the battery with higher accuracy.

DESCRIPTION OF SYMBOLS

Figure 1:
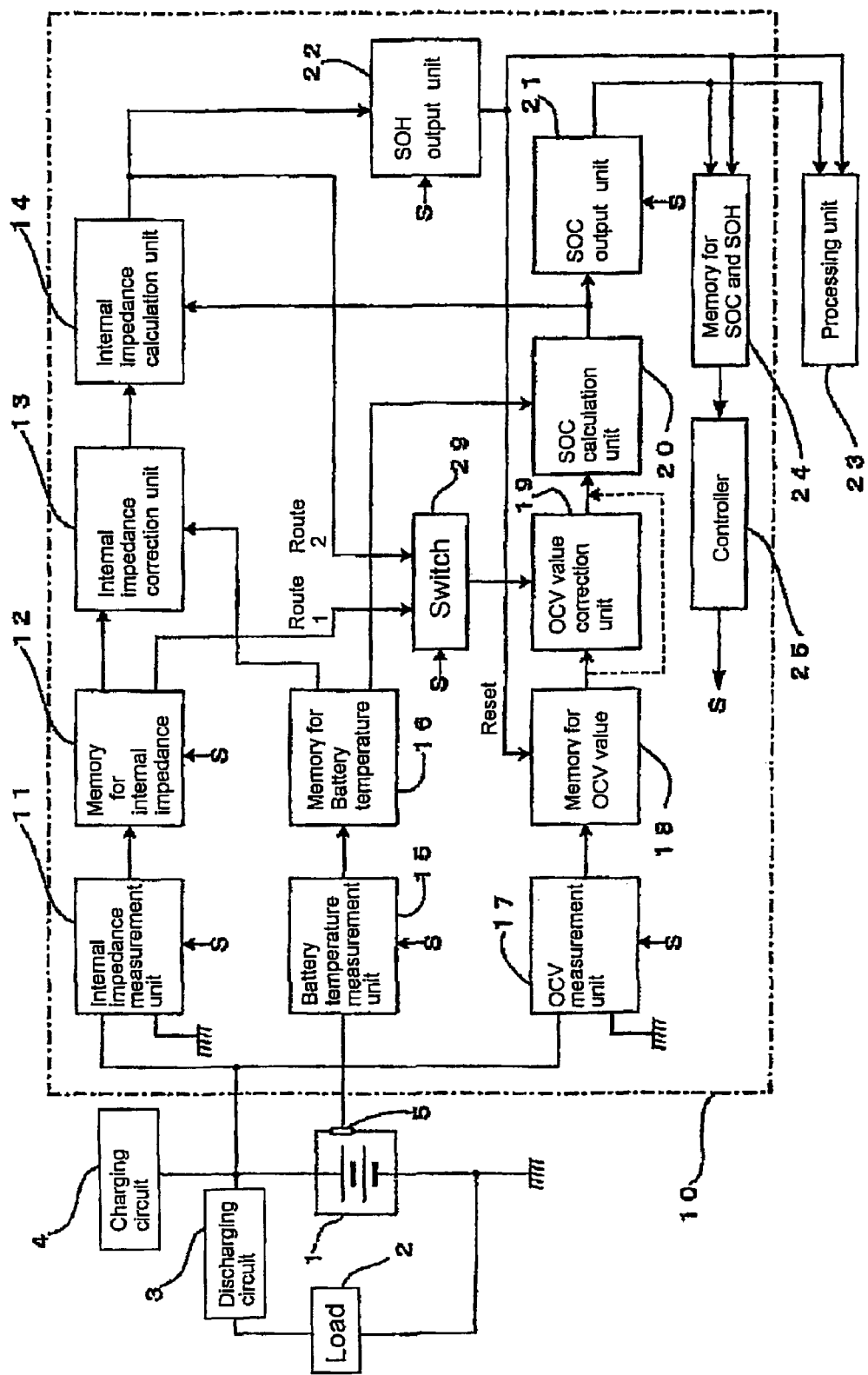
FIG. 1 is a block diagram illustrating a configuration of an apparatus for detecting SOH and SOC of a storage battery according to the first embodiment of the present invention.

1: storage battery
2: load
3: discharging circuit
4: charging circuit
5: temperature sensor
6, 7: ammeter
10: SOH and SOC detection unit
11: internal impedance measurement unit
12: memory for internal impedance
13: internal impedance correction unit
14: internal impedance calculation unit
15: battery temperature measurement unit
16: memory for battery temperature
17: OCV measurement unit
18: memory for OCV value
19: OCV value correction unit
20: SOC calculation unit
21: SOC output unit
22: SOH output unit
23: processing unit
24: memory for SOC and SOH
25: controller
30: SOH and SOC detection unit
31: charge-amount-change calculation unit
32: SOC calculation unit
201: point
202: curve
211: power supply unit for vehicles
212: secondary battery
213: current sensor
214: voltage sensor
215: temperature sensor
216: discharging circuit
217: control section
218: memory
219: path
221: load
222: alternator
231: power supply system for vehicles
232: input unit
233: display unit
311: power supply system
312: battery
313: alternator
314: current sensor
315: voltage sensor
316: estimation unit
317: discharging circuit
318: line
319: load
320: control section

DESCRIPTION OF THE PREFERRED EMBODIMENTS

An apparatus for detecting an SOH and an SOC of a storage battery according to an embodiment of the present invention will be described below.

First Embodiment

FIG. 1 is a block diagram illustrating an apparatus for detecting an SOH and an SOC of a storage battery according to the first embodiment of the present invention.

In FIG. 1, connected to a storage battery 1 is a discharging circuit 3 controlling a current supplied from the storage battery 1 to a load 2, a charging circuit 4 for supplying a charge power, and an SOH and SOC detection unit 10 for measuring SOH and SOC at open circuit.

The SOH and SOC detection unit 10 has an internal impedance measurement unit 11, a memory 12 for internal impedance, an internal impedance correction unit 13, a battery temperature measurement unit 15, a memory 16 for battery temperature, an open circuit voltage (OCV) measurement unit 17, a memory 18 for OCV value, an OCV value correction unit 19, a state of charge (SOC) calculation unit 20, and an internal impedance calculation unit 14. The internal impedance measurement unit 11 is connected to a positive electrode and a negative electrode of the storage battery 1 and measures an internal impedance of the storage battery 1. The memory 12 for internal impedance stores the internal impedance data. The internal impedance correction unit 13 acquires the internal impedance data from the memory 12 for internal impedance and corrects the data based on a battery temperature. The battery temperature measurement unit 15 measures a temperature of the storage battery 1 based on the output signal from a temperature sensor 5 attached to the storage battery 1. The memory 16 for battery temperature stores the battery temperature data of the storage battery 1. The OCV measurement unit 17 is connected to the both electrodes of the storage battery 1 and measures OCV. The memory 18 for OCV value stores the OCV measured values by the OCV measurement unit 17. The OCV value correction unit 19 corrects the measured data stored in the memory 18 for OCV value in accordance with the internal impedance. The SOC calculation unit 20 calculates SOC based on the OCV value corrected by the OCV value correction unit 19. The internal impedance calculation unit 14 further corrects the corrected value of the internal impedance being output from the internal impedance correction unit 13 based on the SOC.

The memory 12 for the internal impedance is configured to: output set values stored therein to the OCV value correction unit 19 via the switch 29 (Route 1 shown in FIG. 1) in the case of the first measurement of the internal impedance in every ridings by the internal impedance measurement unit 11; and output a measured value R1 of the internal impedance measured by the internal impedance measurement unit 11 to the internal impedance correction unit 13 in the case of the second or later measurement in every ridings. The set values of the internal impedance include an initial value $R_0$ set in advance in the memory 12 and a previous last corrected value $R''_{prev}$ lastly obtained in the previous correction by the internal impedance calculation unit 14 and stored in the memory 12. Only in the case of the first measurement of the internal impedance of the new battery, the memory 12 outputs the initial value $R_0$ to the OCV value correction unit 19 as the set value, and in the case of the later measurement, the memory 12 outputs the previous last corrected value $R''_{prev}$ as the set value. It should be noted that the initial value $R_0$ is an internal impedance value at a reference temperature Tx and a reference SOC value $N_0$.

The internal impedance value is defined as the SOH because an internal impedance increases associated with deterioration of the storage battery 1.

The OCV value correction unit 19 is configured to receive either one of the initial value $R_0$ and the previous last corrected value $R''_{prev}$ of the internal impedance from the memory 12 by the Route 1 as described above and also receive a corrected internal impedance value $R''_x$ (x=1, 2, ..., n−1) from the internal impedance calculation unit 14 by the Route 2, by turning the switch 29. The corrected internal impedance value $R''_x$ is described herein after in detail. Further, the OCV value correction unit 19 receives a measured OCV value $V_1$ from the memory 18 for OCV value, and then corrects the measured OCV value $V_1$ of the storage battery 1 to a value $V_0$ at the initial state based on the relationship between the internal impedance and the OCV value exemplified in FIG. 2.

Figure 3:
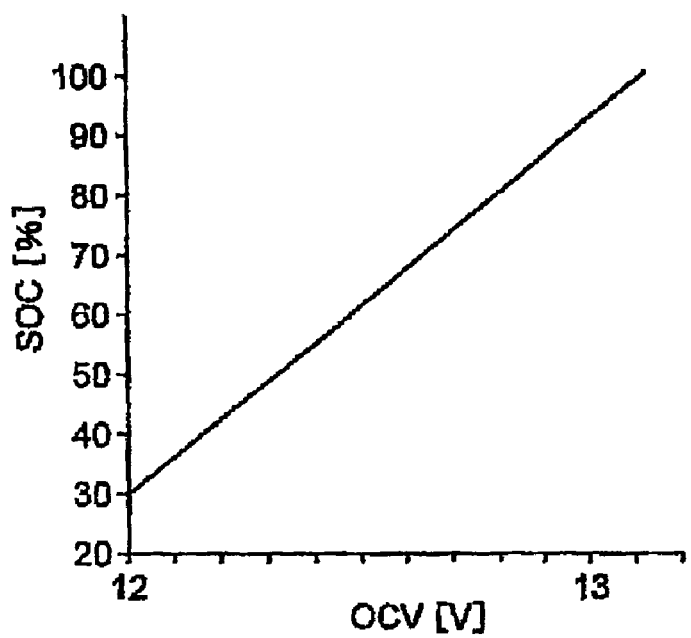
FIG. 3 is a characteristic chart showing the relationship between SOC and OCV of the storage battery to be detected by the apparatus according to the embodiment of the present invention.

The SOC calculation unit 20 receives a corrected OCV value from the OCV value correction unit 19 and calculates an SOC value by substituting the corrected OCV value into a function expressing a relationship between OCV and SOC of the storage battery 1 at the initial state as exemplified in FIG. 3, and then outputs the calculated SOC value $N_x$ (x=1, 2, ..., n) to internal impedance calculation unit 14. The SOC calculation unit 20 repeats this SOC calculation a prescribed n times of at least two (i.e. n indicates a repeat number of the SOC calculation) so as to obtain the last (nth) calculated SOC value $N_n$. The last calculated SOC value $N_n$ is output to both a processing unit 23 (e.g. a display) and a memory 24 for SOC and SOH via an SOC output unit 21. The SOC calculation described above is repeated until, for example, the SOH converges to a specified range.

As the function shown in FIG. 3 includes temperature of the storage batter 1 as a conditioning factor of the variation, the function is corrected based on the value of the temperature by receiving a measured temperature value from the memory 16 for battery temperature. Further, as the function varies with the internal impedance, the function may be corrected based on the corrected internal impedance value corrected by the internal impedance calculation unit 14.

Figure 4:
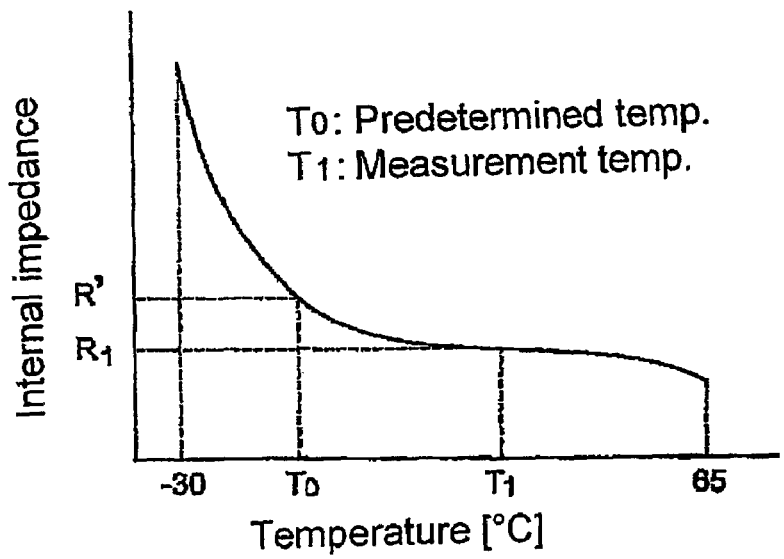
FIG. 4 is a characteristic chart showing the relationship between the temperature and the internal impedance of the storage battery to be detected by the apparatus according to the embodiment of the present invention.

The internal impedance correction unit 13 receives the measured internal impedance $R_1$ of the storage battery 1 measured by the internal impedance measurement unit 11 via the memory 12 for internal impedance and also receives the measured value of the battery temperature from the memory 16 for battery temperature. Then, the internal impedance correction unit 13 makes a correction of converting the internal impedance $R_1$ at the measurement temperature $T_1$ into an internal impedance R' at the predetermined temperature $T_0$ (for example, the normal temperature) based on the relationship between the internal impedance and the temperature exemplified in FIG. 4, further outputs the converted internal impedance value R' to the internal impedance calculation unit 14. The relationship between the internal impedance and the temperature shown in FIG. 4 is under the condition of the reference SOC value $N_0$.

Figure 5:
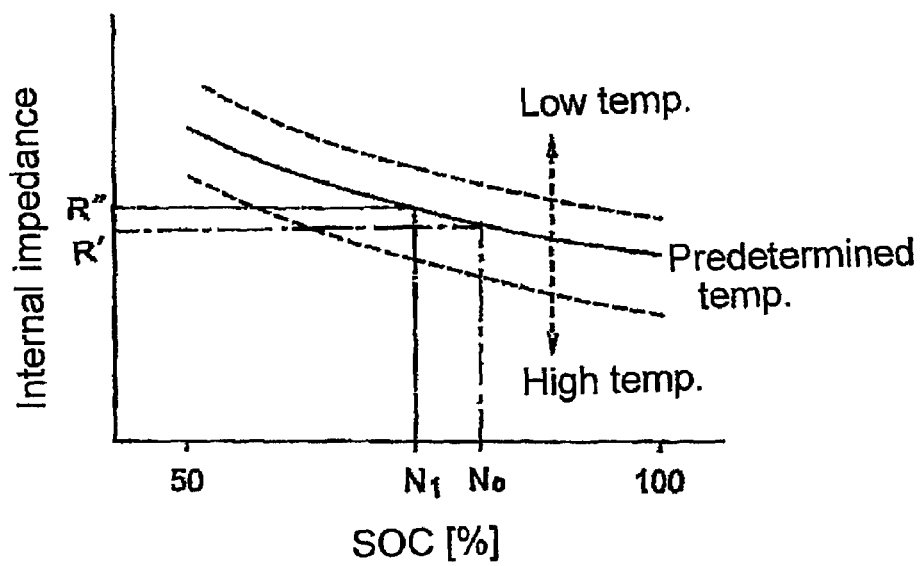
FIG. 5 is a characteristic chart showing the relationship between the internal impedance and the SOC of the storage battery to be detected by the apparatus according to the embodiment of the present invention.

The internal impedance calculation unit 14 receives the converted value R' by the internal impedance correction unit 13 and the calculated value $N_x$ by the SOC calculation unit 20, and corrects the converted internal impedance value R' at the reference SOC $N_0$ to the internal impedance value $R''_x$ at the calculated SOC value $N_x$ according to the relationship between the SOC and the internal impedance value under the predetermined temperature as exemplified in FIG. 5. Further, the internal impedance calculation unit 14 repeats the correction of the internal impedance the n times (n corresponds to the repeat number of the SOC calculation by the SOC calculation unit 20), and outputs the corrected internal impedance values $R''_1$ to $R''_{n-1}$ obtained in the first to the (n−1)th corrections to the OCV value correction unit 19 via the switch 29 and outputs the last (nth) corrected internal impedance value $R''_n$ obtained in the nth correction to an SOH output unit 22.

The SOH output unit 22 defines the last corrected internal impedance value $R''_n$ as the state of health (SOH) and outputs the value $R''_n$ to the processing unit 23 and the memory 24 for SOC and SOH.

The controller 25 directs a measurement timing for the internal impedance measurement unit 11, the battery temperature measurement unit 15 and the OCV measurement unit 17, and also directs an input signal selection for the switch 29. Further, the controller 25 sets a value of the predetermined temperature to the memory 16 for battery temperature and writes the initial value $R_0$ of the internal impedance, the reference SOC value $N_0$, and the last corrected internal impedance value $R''_n$ corrected by the internal impedance calculation unit 14 into the memory 12 for internal impedance. The last corrected internal impedance value $R''_n$ written in the memory 12 will be taken out therefrom as the previous last corrected value $R''_{prev}$ in the next measurement of the internal impedance.

Furthermore, the controller 25 stores the coefficients and functions expressed by the characteristics in FIG. 2 through FIG. 5 to the internal impedance correction unit 13, the internal impedance calculation unit 14, the OCV value correction unit 19, and the SOC calculation unit 20 and sets the repeat number of the internal impedance and SOC calculations in the internal impedance calculation unit 14 and the SOC calculation unit 20.

Figure 6:
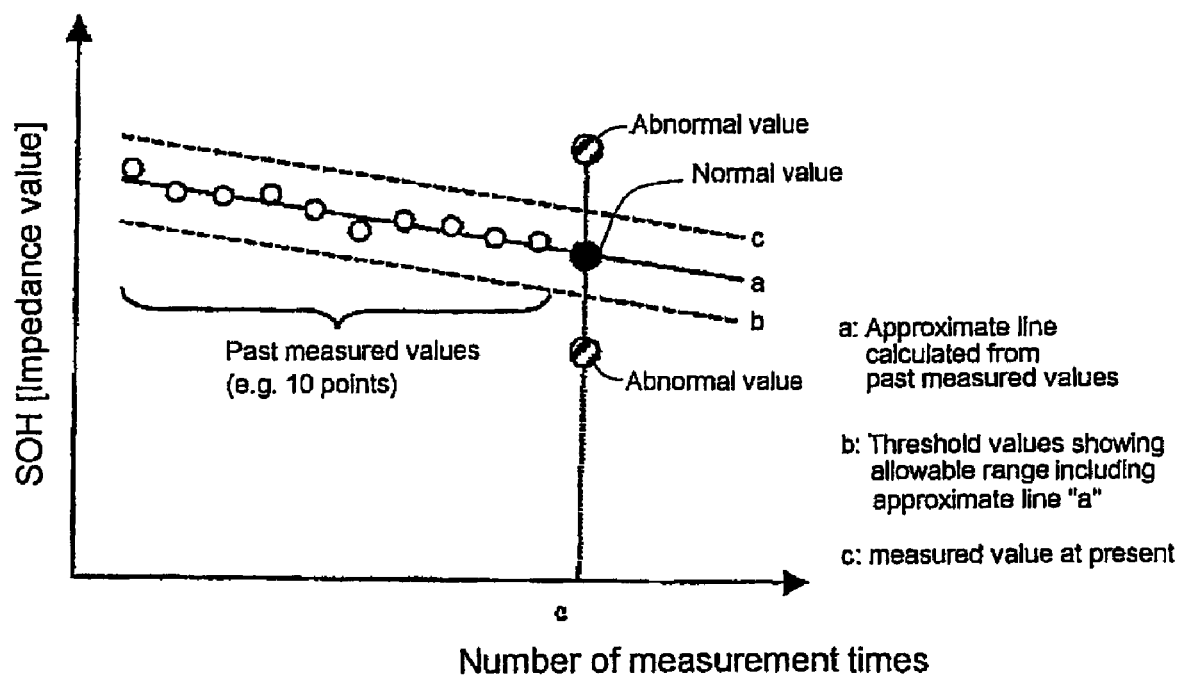
FIG. 6 is a characteristic chart showing a relationship between the SOH and the number of measurement times and also showing an example of an abnormal case of a new measured SOH detected by the apparatus according to the embodiment of the present invention.

Further, the controller 25 determines (i) a slope of a relational expression between SOH values (the internal impedance values) stored in the memory 24 and the number of measurement times as shown in FIG. 6 and (ii) threshold values indicating an allowable range. Further, when a newly input SOH data is out of the allowable range, the controller outputs a detection instruction signal again to the OCV measurement unit 17, the battery temperature measurement unit 15, the internal impedance measurement unit 11 and the like, or issues an alert judging as abnormal.

The conditions such as the initial value and the reference SOC value $N_0$, each correction coefficients, each characteristic and the like are stored in a memory of a computer, and processes such as the calculation, the correction, and the like are carried out according to programs stored in the memory of the computer.

Next, a method for detecting an SOH and an SOC of the storage battery 1 using the above-described SOC and SOH detection unit 10 will be explained according to the flow chart shown in FIG. 7.

Figure 2:
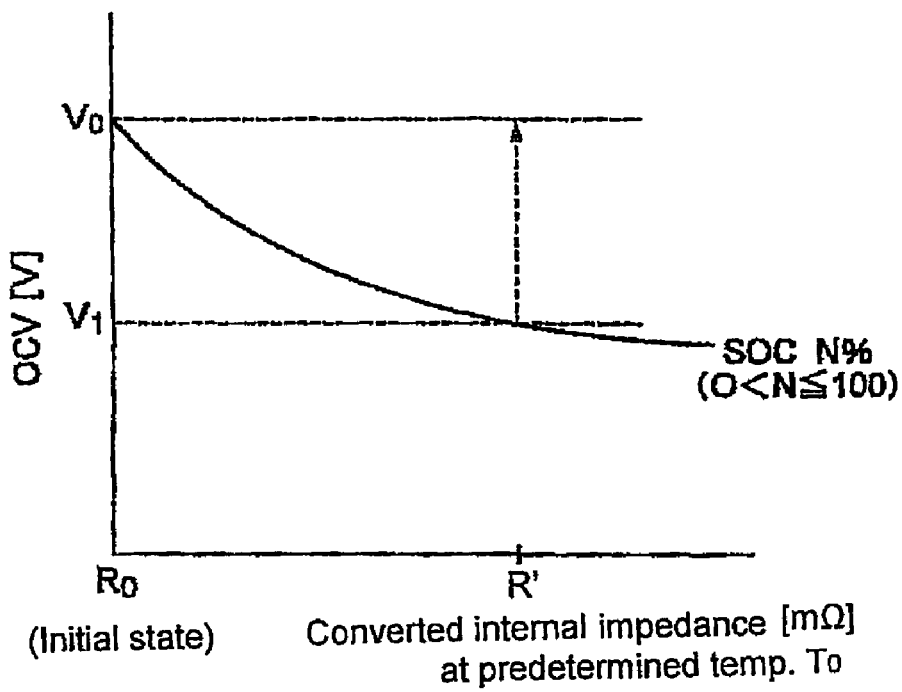
FIG. 2 is a characteristic chart showing the relationship between the internal impedance and the OCV of the storage battery to be detected by the apparatus according to the embodiment of the present invention.

First, either one of the initial value $R_0$ of the internal impedance at the reference SOC value $N_0$ and the previous last corrected value $R''_{prev}$ of the internal impedance lastly obtained in the previous correction is set to the memory 12 for internal impedance, and the predetermined temperature $T_0$ necessary for correcting the internal impedance is written in the memory 16 for battery temperature. Further, the correction coefficient of temperature based on FIG. 4 is set in the internal impedance correction unit 13, the correction coefficient of the SOC value based on FIG. 5 is set in the internal impedance calculation unit 14, an the relationship between the OCV and the corrected internal impedance based on FIG. 2 is set in the OCV value correction unit 19, and a function expressing a relationship between the OCV and the SOC based on FIG. 3 is set in the SOC calculation unit 20. These processes are controlled by the controller 25 (FIG. 7, S10).

Figure 7:
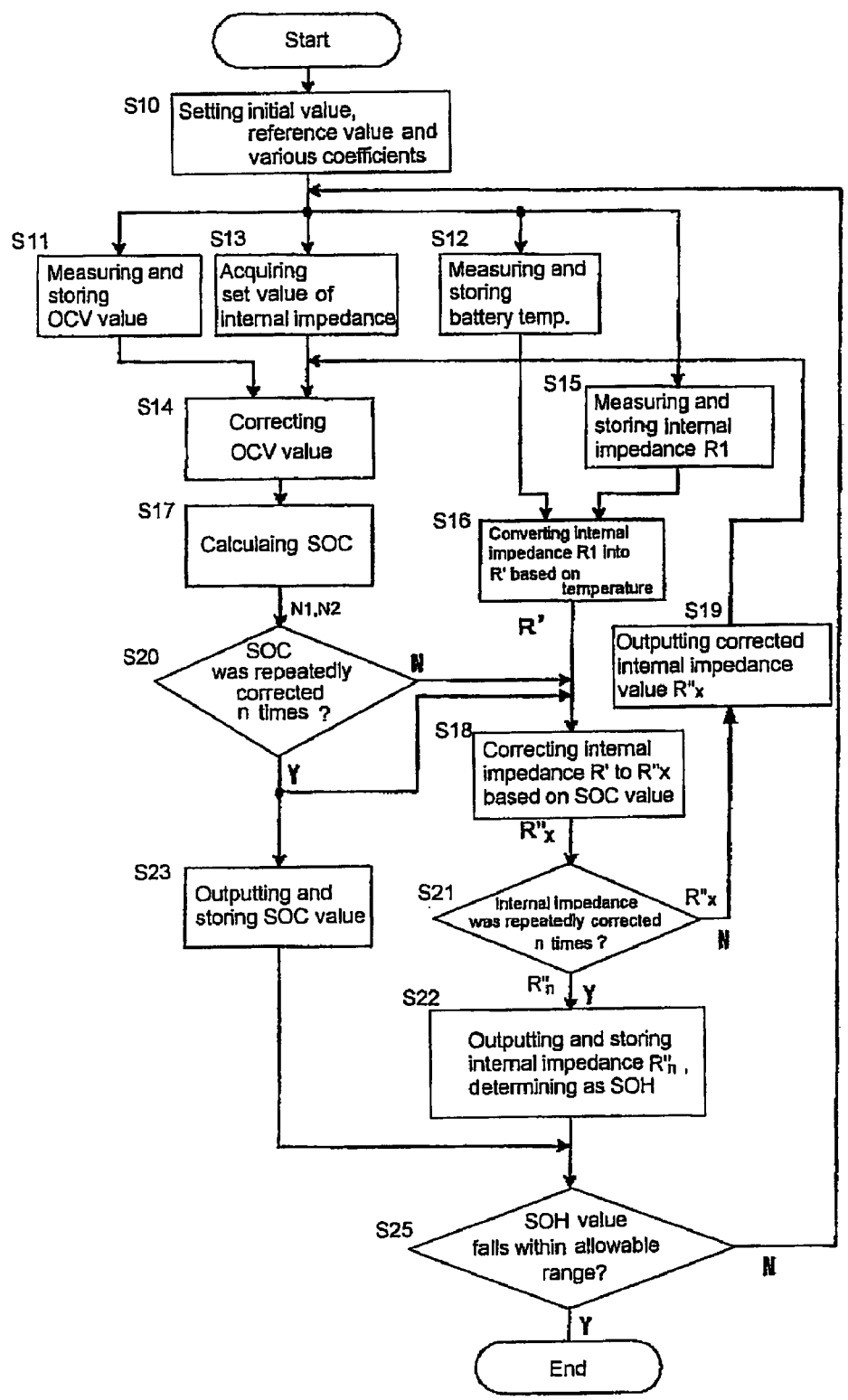
FIG. 7 is a flow chart showing the method for detecting an SOH and of a storage battery according to the first embodiment of the present invention.

Next, according to a instruction signal from the controller 25, the battery temperature measurement unit 15 and the OCV measurement unit 17 perform the measurements of temperature and OCV, respectively, and then, the measured temperature value is stored in the memory 16 for battery temperature, and the measured OCV value is stored in the memory 18 for OCV value (FIG. 7, S11 and S12).

Continuously, the OCV value correction unit 19 acquires either one of the set values of the internal impedance from the memory 12 for internal impedance through the switch 29 (FIG. 7, S13), and then, corrects the measured OCV value into, for example, an OCV value in the initial state of the storage battery 1, based on the correction coefficient of the internal impedance according to FIG. 2 (FIG. 7, S14).

Here, only in the case of the first measurement of the internal impedance of the new-battery by the internal impedance measurement unit 11, the set internal impedance value to be acquired by the OCV value correction unit 19 is the initial value $R_0$ set in advance, and in the case of the later measurement, the set internal impedance value is the previous last corrected value $R''_{prev}$ lastly obtained in the previous correction by the internal impedance calculation unit 14.

As shown in a dashed line between the memory 18 for OCV value and the SOC calculation unit 20 in FIG. 1, the measured OCV value may be input directly to the SOC calculation unit 20, by omitting the correction of the OCV value using the set value of the internal impedance.

The internal impedance correction unit 13 acquires the newest measured value of the internal impedance of the storage battery 1 measured by the internal impedance measurement unit 11 (FIG. 7, S15) from the memory 12 for internal impedance, further acquires the measurement temperature $T_1$ of temperature of the storage battery 1 from the memory 16 for battery temperature. As the measured internal impedance value is the value $R_1$ at the actual temperature of the storage battery 1 on measuring temperature, the internal impedance correction unit 13 makes correction of converting the internal impedance $R_1$ at the measurement temperature $T_1$ into the converted internal impedance R' at the predetermined temperature $T_0$ (for example, the normal temperature), using the correction coefficient of temperature based on FIG. 4, (FIG. 7, S16). The converted value R" is the value under the condition of the reference SOC value $N_0$.

The measurement of the internal impedance is performed by the internal impedance measurement unit 11 according to the instruction from the controller 25, and the measured value $R_1$ is stored in the memory 12 for internal impedance (FIG. 7, S15).

On the other hand, the SOC calculation unit 20 calculates the first SOC value $N_1$ by substituting either one of the corrected OCV value by the OCV value correction unit 19 and the measured value into the pre-set function expressing the relationship between the OCV and the SOC as shown in FIG. 3 (FIG. 7, S14 and S17).

Next, the internal impedance calculation unit 14, using the correction coefficient expressing the relationship between the SOC and the internal impedance at the predetermined temperature $T_0$ as shown in FIG. 5, calculates a new internal impedance (FIG. 7, S18). That is, the converted internal impedance value R' at the SOC value $N_0$ input from the internal impedance correction unit 13 is further corrected to the internal impedance value $R''_1$ at the first SOC $N_1$.

Then, the OCV value correction unit 19, using the internal impedance corrected value $R''_1$ output from the internal impedance calculation unit 14, corrects the measured OCV value again, and outputs the OCV corrected value to the SOC calculation unit 20 (FIG. 7, S19 and S14).

The SOC calculation unit 20 further calculates the second SOC value $N_2$ based on the corrected OCV value, and outputs the second calculated value $N_2$ to the internal impedance calculation unit 14 (FIG. 7, S17). The internal impedance calculation unit 14 receives the second calculated SOC value $N_2$, and then, makes the second correction of the inverted value R' output from the internal impedance correction unit 13, and outputs the second internal impedance corrected value $R''_2$ (FIG. 7, S18).

The SOC calculation unit 20 repeats the above-described SOC calculation the prescribed n times, and the internal impedance calculation unit 14 repeats the correction the prescribed n times based on the calculated SOC value (FIG. 7, S20 and S21). Thereafter, the controller 25 defines the last corrected value $R''_n$ of the internal impedance by the internal impedance calculation unit 14 as the SOH value, and allows the internal impedance correction unit 14 to output the SOH value to both the memory 24 for SOC and SOH and the processing unit 23 via the SOH output unit 22 (FIG. 7, S22). Further, the controller 25 defines the last calculated SOC value $N_n$ by the SOC calculation unit 20 as the SOC value, and allows the SOC calculation unit 20 to output the SOC to both the memory 24 for SOC and SOH and the processing unit 23 via the SOC output unit 21 (FIG. 7, S23).

The SOH value is output from the SOH output unit 22, whereby the memory 18 for OCV value deletes data of the OCV value.

Then, the controller 25 determines an approximate line showing the change of the SOH with respect to the number of measurement times as shown in, for example, FIG. 6 where the horizontal axis indicates the number of measurement times and the vertical axis indicates the SOH. A plurality of points corresponding to the number of measurement times, preferably three or more points, are plotted in the graph. The controller 25 determines the approximate line based on the plotted graph, and determines whether or not the newest measured SOH value exists or converges within a certain allowable range (between the threshold values "b") including the approximate line "a". When being out of the allowable range, the controller 25 allows removing the newest measured SOH value from the memory 24 for SOC and SOH as an abnormal value and allows the respective units to carry out the detections of the SOC and SOH again (FIG. 7, S25). If showing the abnormal value, the forced re-measurement is performed one time or more.

For example, for a sealed lead-acid battery having 5.5 Ah of 5-hour rate capacity in the environmental conditions of −30 degrees C., in the case where the increase of the internal impedance (the SOH) is 2 mΩ/month at the last period of the deterioration of the storage battery, if the detected SOH is 5 mΩ or more away from the approximate line, it can be determined that the detected SOH is abnormal as a measurement value after one month. Therefore, the re-detection is carried out.

When showing the abnormal value, it may perform other processing than the re-detection, for example, issuance of a warning such as sounding an alert and displaying a message.

On the other hand, in the case where the SOH value falls within the allowable range, the SOH value stored in the memory 24 for SOC and SOH is decided as the true value.

As described above, when the detections of SOC and SOH are performed, the detections being interactive each other are set at the same level, and the each other's data during the detections are repeatedly obtained from each other and corrected by each other, whereby the SOC and SOH are finally determined.

Accordingly, the SOC and SOH can be detected at almost the same time with high accuracy.

Further, with the SOH being stored in the memory (i.e., storage medium), a detection error of each SOC and SOH and an abnormal detection can be detected by comparing the detected values with the latest value or the value before the latest, etc., making it possible to conduct an appropriate management of the storage battery.

Second Embodiment

Figure 8:
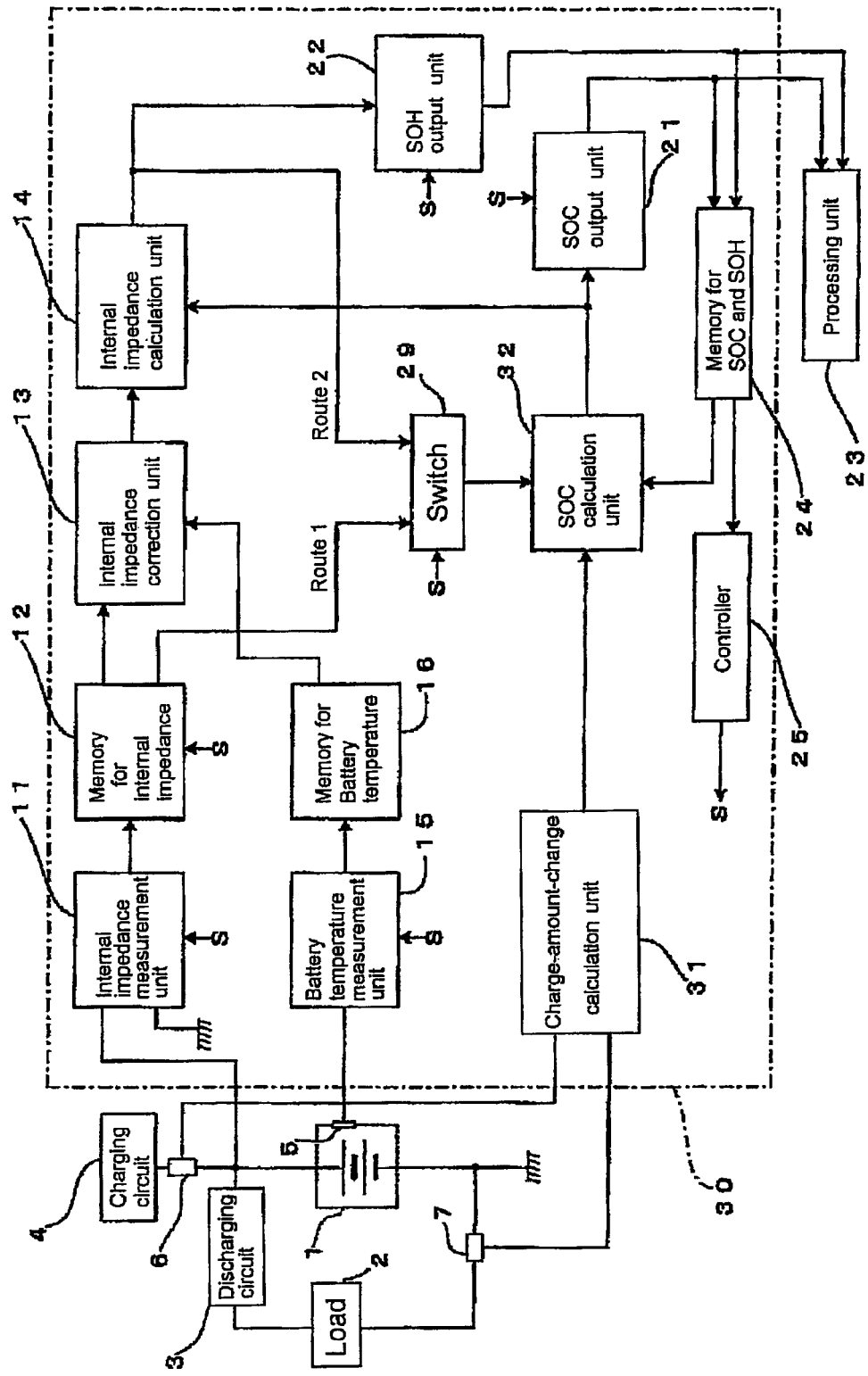
FIG. 8 is a block diagram illustrating a configuration of an apparatus for detecting an SOH and SOC of a storage battery according to the second embodiment of the present invention.

FIG. 8 is a block diagram illustrating a configuration of an apparatus for detecting SOH and SOC of a storage battery related to the second embodiment of the present invention. In FIG. 8, the same parts as in FIG. 1 are designated by the same symbols.

In FIG. 8, the storage battery 1 is connected to the load 2 via the discharging circuit 3 and further connected to the charging circuit 4 and an SOH and SOC detection unit 30. Connected between the charging circuit 4 and the storage battery is a first ammeter 6. Connected between the load 2 and the storage battery 1 is a second ammeter 7.

The SOH and SOC detection unit 30, as the same as shown in the above mentioned embodiment, has the internal impedance measurement unit 11, the memory 12 for internal impedance, the internal impedance correction unit 13, the battery temperature measurement unit 15, the memory 16 for battery temperature, the switch 29, the SOC output unit 21, and the SOH output unit 22.

Further, the SOH and SOC detection unit 30 has a charge-amount-change calculation unit 31 and an SOC calculation unit 32. The charge-amount-change calculation unit 31 calculates both a change in the charge amount and a change in the SOC value in a prescribed time period, based on the product of time and both the charge current and the discharge current detected by the first and second ammeters 6 and 7. The SOC calculation unit 32 corrects the change in the SOC value in accordance with the internal impedance value and adds the corrected change in the SOC value to a previous last calculated SOC value being stored in memory 24 for SOC and SOH, so as to output it as an SOC output value.

The SOC calculation unit 32 is configured to receive the internal impedance value from either the memory 12 for internal impedance or the internal impedance calculation unit 14 through the switch 29 and to output the calculated SOC value to the internal impedance calculation unit 14.

Further, the last calculated SOC value obtained after repeating the SOC calculation the prescribed n times of at least two by the SOC calculation unit 32 is output to the processing unit 23 and the memory 24 for SOC and SOH thorough the SOC output unit 21.

Next, a method for detecting SOH and SOC of the storage battery 1 with the SOC and SOH detection unit 10 described above will be explained according to the flow chart shown in FIG. 9.

Figure 9:
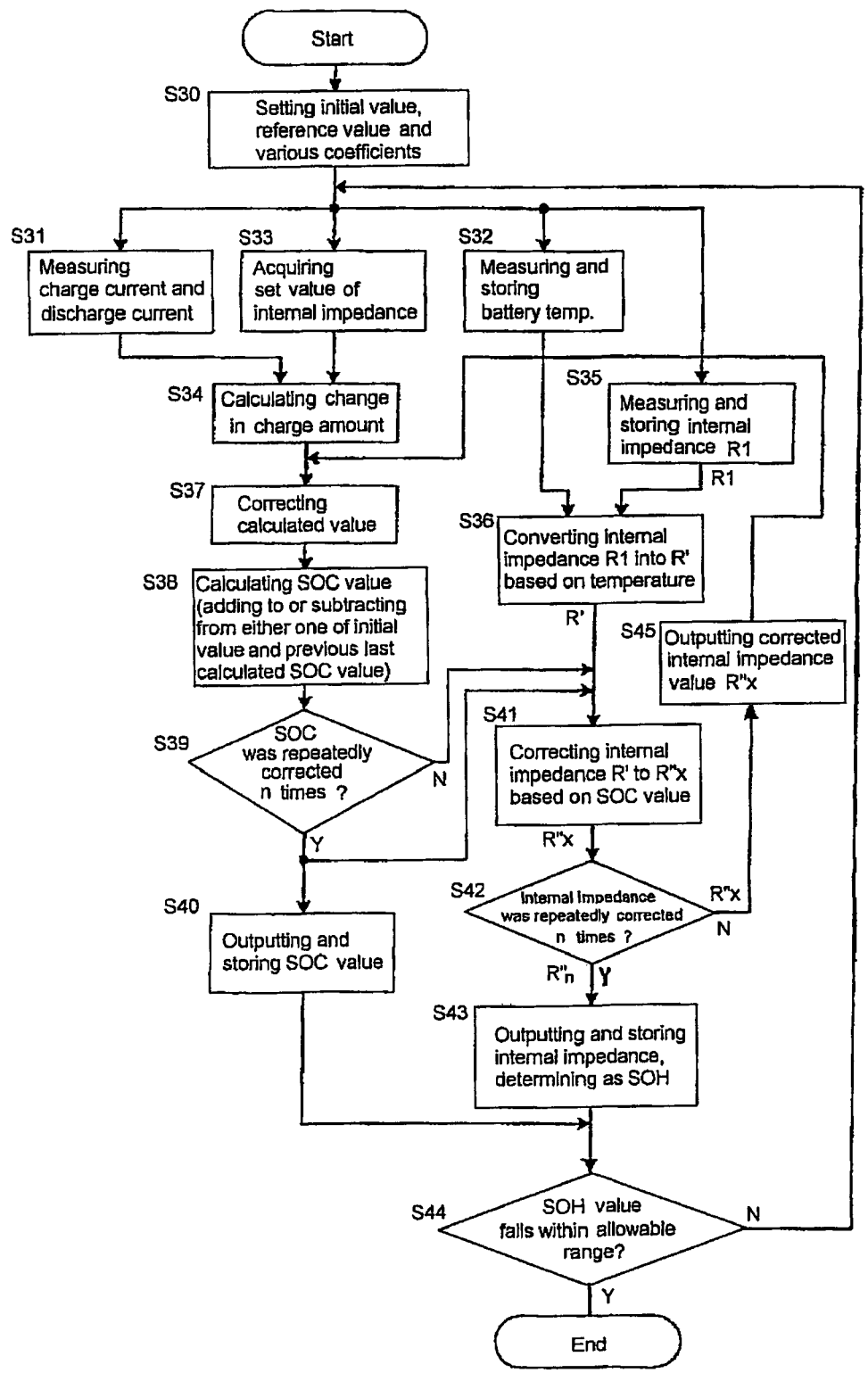
FIG. 9 is a flow chart showing the method for detecting an SOH and SOC of a storage battery according to the second embodiment of the present invention.

First, as explained in the above-described first embodiment, the internal impedance correction unit 13 makes the correction of converting the measured internal impedance $R_1$ stored in the memory 12 for internal impedance into the internal impedance R' based on temperature (FIG. 9, S30, S32, S35, and S36).

The converted internal impedance value R', as the same as the above-mentioned first embodiment, is further corrected by the internal impedance calculation unit 14 based on the SOC value $N_x$ output from the SOC calculation unit 32, so that the corrected internal impedance $R''_x$ is obtained. After repeating the correction of the internal impedance R' the prescribed n times, the last corrected value $R''_n$ being defined as the SOH is output from the SOH output unit 22 (FIG. 9, S41, SS42, and S43).

Further, the charge-amount-change calculation unit 31 calculates both the charge in the charge amount and the change in the SOC value in a predetermined time period, based on the product of time and both the charge current and the discharge current detected by the first and second ammeters 6 and 7 (FIG. 9, S31 and S34). In this case, the discharge current is represented as negative, and the charge current is represented as positive.

Meanwhile, since a full-charge capacity of the storage battery 1 changes depending on the SOH of the storage battery 1, the change in the SOC value calculated by the charge-amount-change calculation unit 31 is further corrected by the SOC calculation unit 32, based on either one of the initial value $R_0$ set in advance and the previous last corrected value $R''_{prev}$ lastly obtained in the previous correction which are output from the memory 12 for internal impedance (FIG. 9, S37). The correction based on the initial value $R_0$ may be omitted.

Further, in the SOC calculation unit 32, the corrected change in the SOC value is added to either one of the initial value thereof and the previous last calculated SOC value obtained in the previous calculation stored in the memory 24 for SOC and SOH, whereby the SOC calculation unit 32 calculates a new SOC (FIG. 9, S38). The previous last calculated SOC value lastly obtained in the previous calculation has been taken from the memory 24 for SOC and SOH and has been written to the memory 12 for internal impedance by the controller 25.

The newly calculated SOC value is transmitted to the internal impedance calculation unit 14. Then, the internal impedance calculation unit 14 corrects the internal impedance value R' based on the newly calculated SOC value and outputs the corrected internal impedance value $R''_x$ to the SOC calculation unit 32 through switch 29 (FIG. 9, S41).

The calculation of the SOC value is repeated a prescribed n times by the SOC calculation unit 32 and the last calculated SOC value is output by the SOC output unit 21 (FIG. 9, S38, S39, and S40).

The SOC value and the SOH value calculated by means of the above process are output to the memory 24 for SOC and SOH and the processing unit 23 as the same of the above embodiment (FIG. 9, S40 and S43).

Further, the controller 25, as the same of the above-mentioned first embodiment, determines an approximate line showing the change of the SOH with respect to the number of measured times, based on the plotted graph in which a plurality of points corresponding to the number of measurement times, preferably three or more points, are plotted, where the horizontal axis indicates the number of measurement times and the vertical axis indicates the SOH. Further, the controller 25 determines whether or not the newest measured value exists or converges within a certain allowable range including the approximate line. When being out of the allowable range, the controller 25 allows removing the newest measured value from the memory 24 for SOC and SOH as an abnormal value and allows the respective units to carry out the detections of SOC and SOH again (FIG. 9, S44). When showing the abnormal value, the forced re-measurement is performed one time or more. Alternatively, it may perform other processing than the re-detection, for example, issuance of a warning such as sounding an alert and displaying a message.

On the other hand, in the case where the SOH value falls within the allowable range, the SOH stored in the memory 24 for SOC and SOH is decided as the true value.

As explained above, when the detections of SOC and SOH are performed, the detections being interactive each other are set at the same level, and the each other's data during the detections are repeatedly obtained from each other and corrected by each other, whereby the SOC and the SOH are finally determined. This makes it possible to detect the SOC and the SOH at almost the same time with high accuracy.

Further, with the SOH value being stored in the memory (i.e., storage medium), a detection error of each SOC and SOH and an abnormal detection can be detected by comparing the detected values with, for example, the last calculated value obtained in the previous calculation or obtained therebefore, making it possible to conduct an appropriate management of the storage battery.

In detections of SOC and SOH, each other's measured value is mutually affected, and both detections, i.e. both measurement values, can not be uniquely determined but is determined depending on the temperature and detected information of another side. According to this embodiment, as described above, since the measured SOC and SOH are mutually used as a detection condition, the high-accuracy detection can be achieved enough to satisfy a user.

Third Embodiment

Next, a method and an apparatus for detecting deterioration of a secondary battery and a power supply system therewith according to a preferable embodiment of the present invention will be explained in detail with reference to drawings.

Hereinafter, there will be explained an embodiment in the case where the present invention is applied to a power supply unit for vehicles and power supply system for vehicles having a function of determining a deterioration of a secondary battery mounted on a vehicle and the like.

Figure 11:
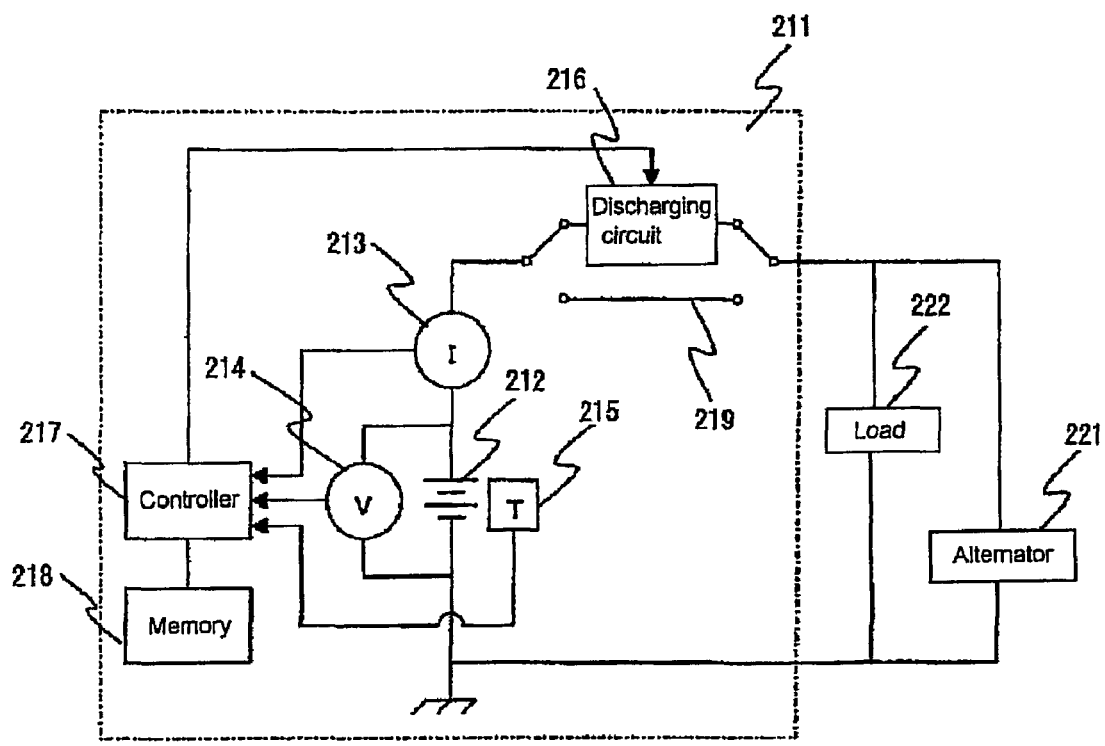
FIG. 11 is a block diagram illustrating the schematic configuration of a power supply unit for vehicles according to the third embodiment of the present invention.

FIG. 11 is a block diagram illustrating the configuration of a power supply unit according to the third embodiment of the present invention. In FIG. 11, a power supply unit 211 for vehicles includes a secondary battery 212, a current sensor 213 for measuring a current of the secondary battery 212, a voltage sensor 214 for measuring a voltage of the secondary battery, and a temperature sensor 215 for measuring a temperature of the secondary battery 212. The unit also includes a discharging circuit 216, a controller 217, and a memory 218, to determine the deterioration of the secondary battery 212.

The power supply unit 211 for vehicles is connected to an alternator 222 and a load 221 consisting of various electric devices for a vehicle and is configured such that the electric power is supplied to the load 222 from either the secondary battery 212 or the alternator 222. The alternator 222 also supplies a charging electric power to the charge secondary battery 212.

The power supply unit 211 for vehicles having a configuration as shown in FIG. 11 allows the secondary battery 212 to be charged or be discharged with a specified current and timing to determine SOH of the secondary battery 212. In the case where the secondary battery 212 is discharged with a specific current, the discharge is carried out by connecting the discharging circuit 216 to the secondary battery 212. In the case where the secondary battery 212 is charged, the current is supplied from alternator 222 to the secondary battery 212. In other words, the alternator 222 is employed as a charging circuit in this embodiment. In this case, the current is allowed to flow through a path 219 to bypass the discharging circuit 216.

When the secondary battery 212 is charged or discharged as described above, a current and a voltage at that time are measured by the current sensor 213 and the voltage sensor 214, respectively, and the measured current value and the measured voltage value are sent to the controller 217.

After the controller 217 receives the measured current value and the measured voltage value from the current sensor 213 and the voltage sensor 214, respectively, the controller 217 determines the SOH by calculating the internal impedance or the internal resistance of the secondary battery 212 based thereon by using the method described hereinafter. The controller 217 also judges as to whether discharging or charging the secondary battery with the specified current and timing and then controls on/off of the connection between the discharging circuit 216 and the secondary battery 212 based on the judged result.

As for judging as to whether discharging or charging the secondary battery 212 with the specified current, it may be practicable that, for example, a charge or discharge selection signal is pre-set in the memory 218, and the controller 217 reads the charge or discharge selection signal from memory 218 so as to judge as to whether charging or discharging the secondary battery 212.

The power supply unit 211 for vehicles of the present invention also includes the temperature sensor 215. The temperature sensor 215 is arranged near the secondary battery 212 and measures the temperature of the secondary battery 212 to send the measured temperature to the controller 217.

In this embodiment, an AC of 100 Hz or above frequency, or a pulse current is used as the specified current when carrying out the charge or discharge of the secondary battery 212. It is noted that, when using the pulse current, the measured values of current and voltage measured within 10 ms of applying the pulse current is used for the calculation of the internal resistance. The specified current described above makes it possible to eliminate the influence of the noise from the alternator 222 or the load 221 as much as possible.

The selection of either the AC of 100 Hz or above frequency or the pulse current can be carried out by the controller 217, based on DC or AC selection signal read from the memory 218. In order to apply the AC of 100 HZ or above frequency from the alternator 222 to secondary battery 212, it is required that the power supply unit is provided with a specified charging circuit instead of the path 219.

Figure 10:
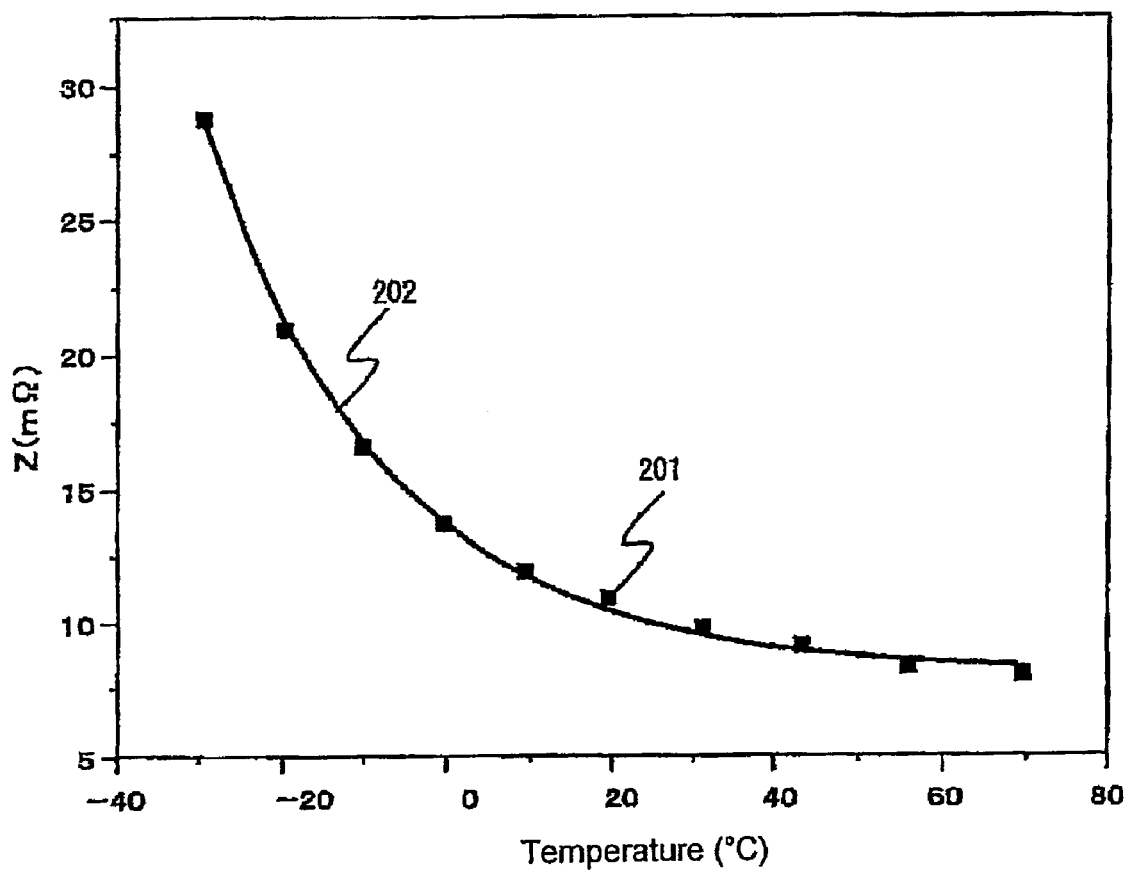
FIG. 10 is a graph showing one example of temperature characteristic of a secondary battery where the vertical axis indicates the internal impedance and the horizontal axis indicates the temperature of the secondary battery.

Next, the temperature characteristic of the internal impedance or the internal resistance of the secondary battery 212 will be explained by using FIG. 10. FIG. 10 is a graph showing one example of the temperature characteristic of the secondary battery where the vertical axis indicates the internal impedance and the horizontal axis indicates the temperature of a secondary battery. In FIG. 10, points 201 respectively indicate the magnitude of the internal impedance measured at each temperature.

In the example shown in FIG. 10, each of the internal impedance of the secondary battery 212 was measured by using the AC of 100 Hz frequency.

According to FIG. 10, it is recognizable that the internal impedance of the secondary battery increases with lowering the temperature, especially, dramatically increases at below the freezing point. The temperature characteristic shown in the FIG. 10 shows that the internal impedance changes depending on a time period of using the secondary battery and that there is the deterioration caused by aging such that the internal impedance increases with time of using the battery. Although the characteristic of the internal impedance was explained in the above-described example, the internal resistance measured by using the DC also has the same temperature characteristic.

Generally, the secondary battery 212 for vehicles is used at wide-range temperature, it is required that the secondary battery 212 should have an appropriate internal impedance and the internal resistance at a range of operating temperature. Therefore, when the controller 217 in the power supply unit 211 for vehicles 211 determines the SOH of the secondary battery 212, it is important that the temperature characteristics of the internal impedance or the internal resistance of the secondary battery 212 described above can be evaluated accurately.

Accordingly, in the method of determining SOC of a secondary battery according to the present invention, a specified temperature characteristic function accurately expressing the temperature characteristic of the internal impedance or the internal resistance of the secondary battery 212 is generated beforehand for use. In the method for determining SOH of a secondary battery according to the present invention, a temperature of the secondary battery 212 is measured at the same time when measuring the current and the voltage, and an internal impedance or an internal resistance of the secondary battery 212 calculated by the measured current value and measured voltage value are converted to an internal impedance or an internal resistance at specified reference temperature by using the specified temperature characteristic function.

The temperature characteristic function used in the method for determining SOH of a secondary battery according to the present invention is characterized by containing at least one exponential terms and one adjustment parameter. One example of the temperature characteristic function is shown in the following expression (1).

$$Z(\text{Temp}) \text{ or } R(\text{Temp}) = f(C) \times \exp\{g(C)/\text{Temp}\} + C \quad (1)$$

where Z is the internal impedance of the secondary battery 212, R is the internal resistance of the secondary battery 212, Temp is the temperature of the secondary battery 212, C is the adjustment parameter, and f and g are functions of C The expression (1) contains only one exponential term, however, may contain further exponential terms. In any way, the number of exponential terms and the functional forms of the functions f(C) and g(C) may be decided such that the expression (1) can accurately express the internal impedance Z or the internal resistance R of the secondary battery 12. In FIG. 10, a curve 202 indicates one example of the temperature characteristic function expressed by the expression (1).

A concrete functional form of a temperature characteristic function indicated by the curve 202 is shown in the following expression (2).

$$Z(\text{Temp}) = 5.435 \times \exp\{-22.81/\text{Temp}\} + 8.176 \quad (2)$$

C, f, and g in the expression (2) are respectively set as follows:

$$C = 8.176 \quad (3)$$

$$f(C) = 0.6648 \times C = 5.435 \quad (4)$$

$$g(C) = -2.790 \times C = -22.81 \quad (5)$$

As shown in the FIG. 10, the internal impedance (a curve 202) calculated by using the expression (2) agrees with the measured values (points 201) very well, and $R^2 = 0.99854$.

In the method of determining SOH of a secondary battery according to the present invention, a first internal impedance Z or a first internal resistance R are calculated based on the measured current value and measured voltage value when the secondary battery is discharged or charged. Since a temperature of the secondary battery is also measured at that time, the value of the adjustment parameter C is decided by substituting the internal impedance Z or the internal resistance R thus calculated and the measured temperature value Temp into the expression (1).

The temperature characteristic of the internal impedance or the internal resistance of the secondary battery varies depending on the deterioration caused by aging from the start of use and the like. The adjustment parameter C is a parameter for allowing the expression (1) to agree with the temperature characteristic at the time by adjusting the variation of the temperature characteristic depending on the deterioration caused by aging, and the like.

After the adjustment parameter C is decided, a specified reference temperature Tx is substituted into Temp of the expression (1) using the decided value C. As a result, the internal impedance or the internal resistance at the specified reference temperature Tx is calculated by using the expression (1). Then, the SOH of the secondary battery 121 can be determined by comparing the calculated internal impedance or the calculated internal resistance with a specified threshold.

Figure 12:
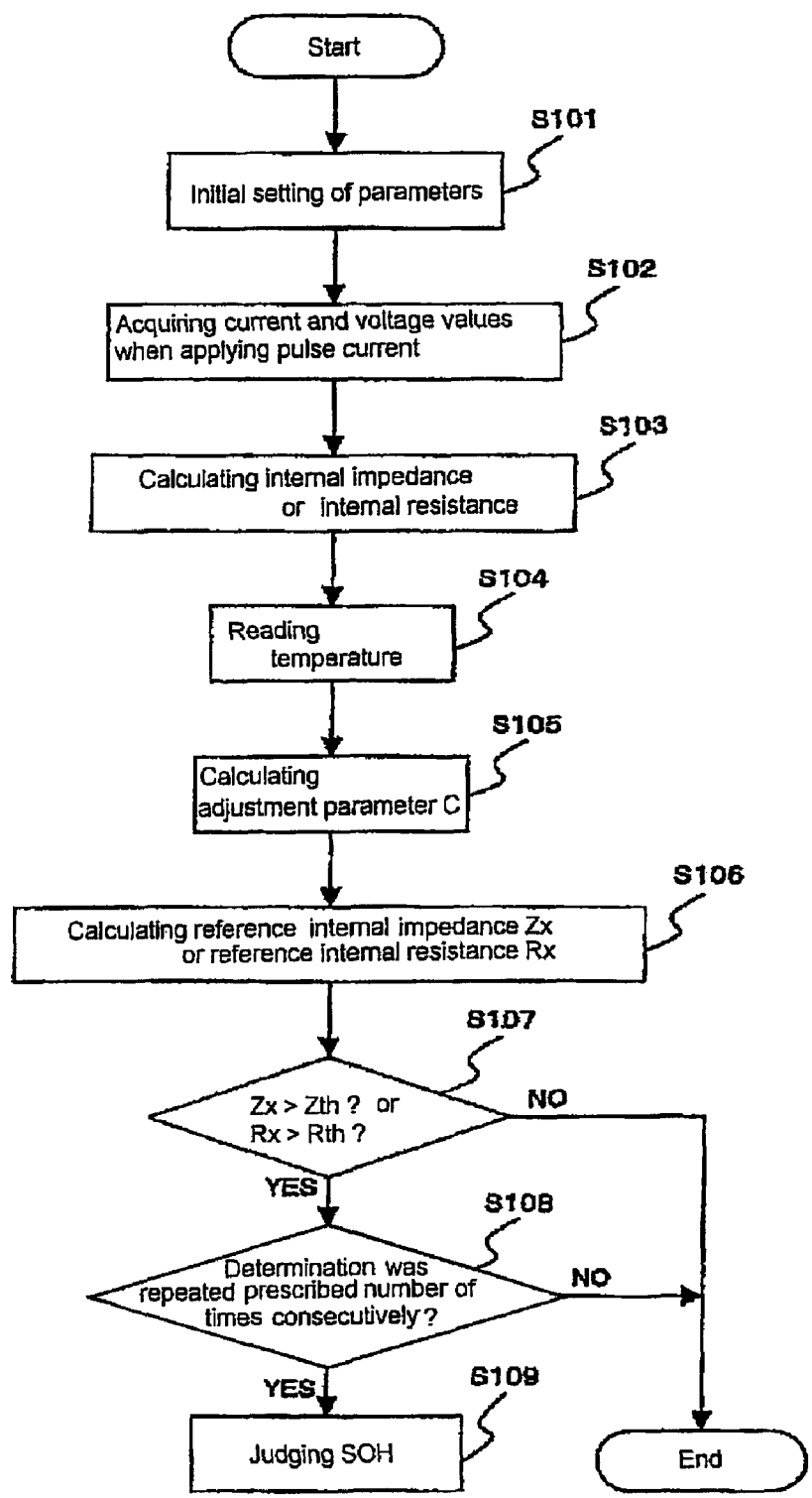
FIG. 12 is a flow chart showing the operation process carried out mainly by the controller 217.

Next, there will be explained one example of concrete process flow for performing the determination of SOH of the secondary battery 212 in power supply unit 211 for vehicles according to the present invention. FIG. 12 is a flow chart showing the operation process carried out mainly by the controller 217. The operation process shown in FIG. 12 is started in the power supply unit 211 for vehicles at a specified timing being set in advance. Although FIG. 12 shows an example of performing the determination of SOH of the secondary battery 212 based on the internal impedance, if performing the determination of the SOH based on the internal resistance, the internal impedance may be replaced by the internal resistance in FIG. 12.

In FIG. 12, when reaching the specified timing, the operation process at the controller 217 is started. First, an initial setting of parameters necessary for the operation process is carried out at the step S101. Setting values of each parameter may be set by reading pre-set values from the memory 218 at the step S101.

Parameters to be set at the step S101 includes the reference temperature Tx for estimating the internal impedance or the internal resistance, determination thresholds Zth and Rth with respect to the internal impedance and the internal resistance for determining the SOH of the secondary battery 212, and the like. The charge or discharge selection signal and the DC or AC selection signal as well may be read from the memory 218 at the step S101. In the case where the controller 217 gives instructions for discharging or charging the secondary battery to the discharging circuit 216 or the alternator 222, an AC frequency or a pulse width of a pulse current may be read from the memory 218 so as to execute the initial setting at the step S101.

Appropriate initial setting values in accordance with the characteristic of the secondary battery 212 can be fixed in advance, but the initial setting values may be changeable as needed depending on the operating situations, the deterioration caused by aging of the secondary battery 212, and the like.

Next, at the step S102, the discharging circuit 216 or the alternator 222 allow the secondary battery to be charged or discharged with the specified current of the AC or a pulse current, and the measured current value and the measured voltage value are acquired from the current sensor 213 and the voltage sensor 214, respectively, at a specified timing.

At the step S103, the internal impedance Z of the secondary battery 212 is calculated by means of the Fourier expansion and the like, using the measured current value and measured voltage value acquired at the step S102. The internal resistance R can be calculated by using the expression of $R=dV/dI$, where dV and dI are the voltage change and the current change, respectively, during a specified time period dt not exceeding 10 ms of starting the discharge or the charge of a pulse current.

Next, at the step S104, a measured temperature value Tp of the secondary battery 212 at the time when the discharge or the charge is performed is input from the temperature sensor 215. Then, at the step S105, the calculated internal impedance Z calculated at the step S103 and the measured temperature value Tp input at the step S104 are substituted into the expression (1) so as to calculate the value of the adjustment parameter C.

Next, at the step S106, using the reference temperature Tx set at the step S101 and the adjustment parameter C calculated at the step S105, the internal impedance Zx at the reference temperature Tx is calculated by using the following expression (6).

$$Zx(Tx)=f(C)\times\exp\{g(C)/Tx\}+C \quad (6)$$

Next, at the step S107, the internal impedance Zx at reference temperature Tx calculated at step S06 is compared with the determination threshold Zth set at the step S101, thereby judging which of the Zx and Zth is high. Then, if the internal impedance Zx is judged as being equal to or less than Zth, i.e. $Zx \leq Zth$, the secondary battery is determined as not being deteriorated and the processing is completed.

On the contrary, if the internal impedance Zx is judged as exceeding Zth, i.e. $Zx>Zth$, the secondary battery 212 is determined as being possible to be deteriorated. In the method for determining SOH of this embodiment shown in FIG. 12, in order to ensure the SOH determination for the secondary battery 212, the secondary battery 212 is determined as being deteriorated only when the determination at the step S107 is repeated a prescribed number of times consecutively.

More specifically, if it is determined at the step S107 as being that there is a possibility of the deterioration of the secondary battery 212, it is determined at the step S108 as to whether or not the determination is repeated the prescribed number of times consecutively. If the secondary battery 212 is determined as being deteriorated the prescribed number of times consecutively as a result of the determinations, the process proceeds to the step S109 and the SOH determination of the secondary battery 212 is executed. As described above, the reason of the confirmation as to whether or not the SOH determination is repeated a prescribed number of times consecutively is for preventing the influence of the variation of the internal impedance so as to stabilize the judgment result.

Figure 13:
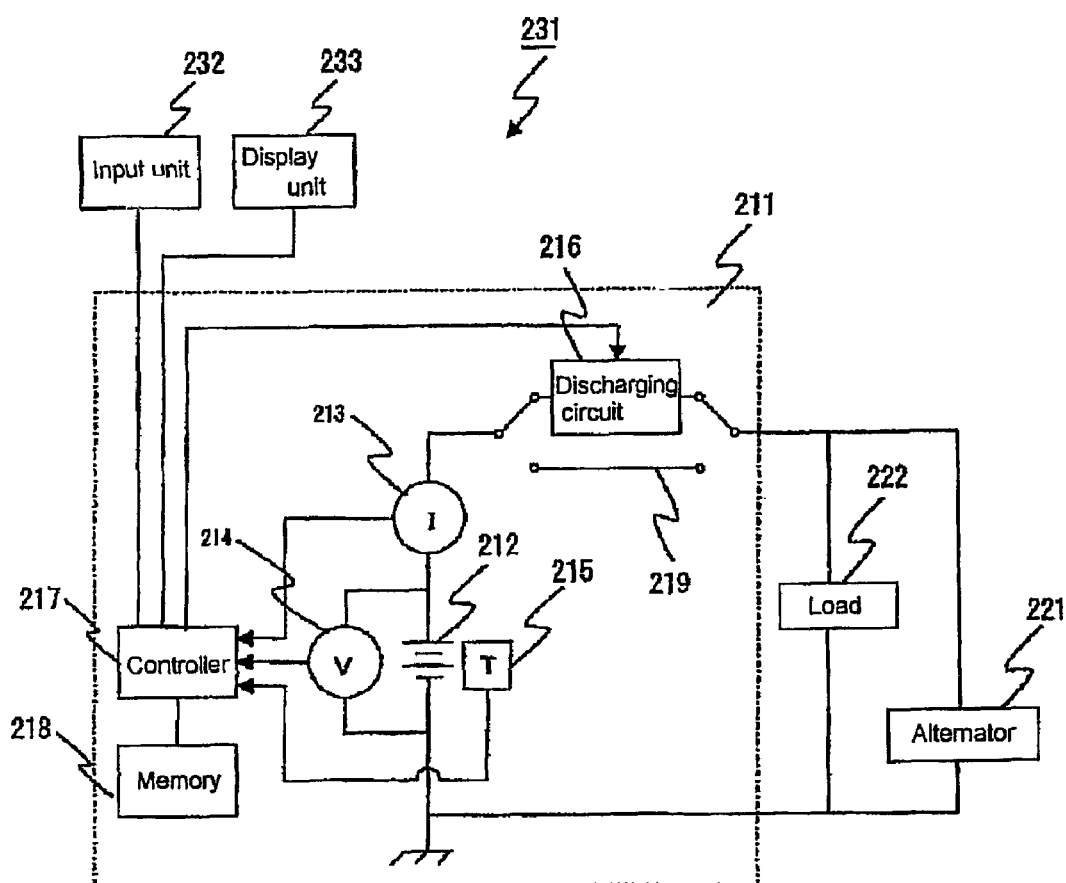
FIG. 13 is a block diagram illustrating an embodiment of a power supply system for vehicles according to the present invention.

Next, a power supply system for vehicles provided with a power supply unit for vehicles according to the present invention will be explained below. FIG. 13 is a block diagram illustrating the present embodiment of a power supply system for vehicles according to the present invention. A power supply system 231 for vehicles includes the power supply unit for vehicles 211, an input unit 232, and a display unit 233.

The input unit 232 and the display unit 233 are connected to the controller 217 and are configured such that data is input thereto and output therefrom. In the case where the secondary battery 212 is determined as being deteriorated at the step S109, the result is sent from the controller 217 to the display unit 233 so as to be displayed thereon. This makes it possible to notify the driver of the deterioration of the secondary battery 212.

The input unit 232 is usable for setting, for example, the determination threshold for the internal impedance of the secondary battery 212, the determination threshold for the internal resistance, the charge or discharge selection signal, the DC or AC selection signal, the AC frequency, and the pulse width of the pulse current, into the memory 218. In the embodiment shown in FIG. 13, each data is set into the memory 218 through the controller 217.

The power supply system for vehicles configured as described above enables the prompt and clear notification to the driver of the deterioration of the secondary battery. Further, the various setting values is easily changeable by using the input unit 232, making it possible to carry out the proper treatment depending on the operating situations, the deterioration of the secondary battery 212 caused by aging, and the like.

In the above-described embodiment, while the power supply system for vehicles having the configuration for determining the deterioration of the secondary battery for vehicles mounted on a vehicle was explained, the present invention is not limited to a secondary battery for vehicles and can be widely applied to various power supply systems provided with a general secondary battery.

Fourth Embodiment

A method for estimating a deterioration level or a discharge capability of a battery according to the present invention includes: calculating an impedance Za of a battery from the measured current value and the measured voltage value of the battery and calculating a superimposed DC component IDCa from the measured current value; and estimating an impedance Zb in the case when a reference direct current IDCb value is superimposed, from the calculated impedance Za value and the calculated superimposed DC component IDCa value, based on a predetermined relational expression between a superimposed direct current IDC and a impedance Z so as to determine the deterioration level or the discharge capability of the battery.

Preferably, in the above relational expression between the superimposed direct current IDC and the impedance Z, the impedance Z is expressed by a function having at least one exponential term of the superimposed direct current IDC. Especially, the following relational expression (7) is preferable.

$$Z = a1 \times \exp(-IDC/b1) + a2 \times \exp(-IDC/b2) + \ldots + c \quad (7)$$

Figure 15:
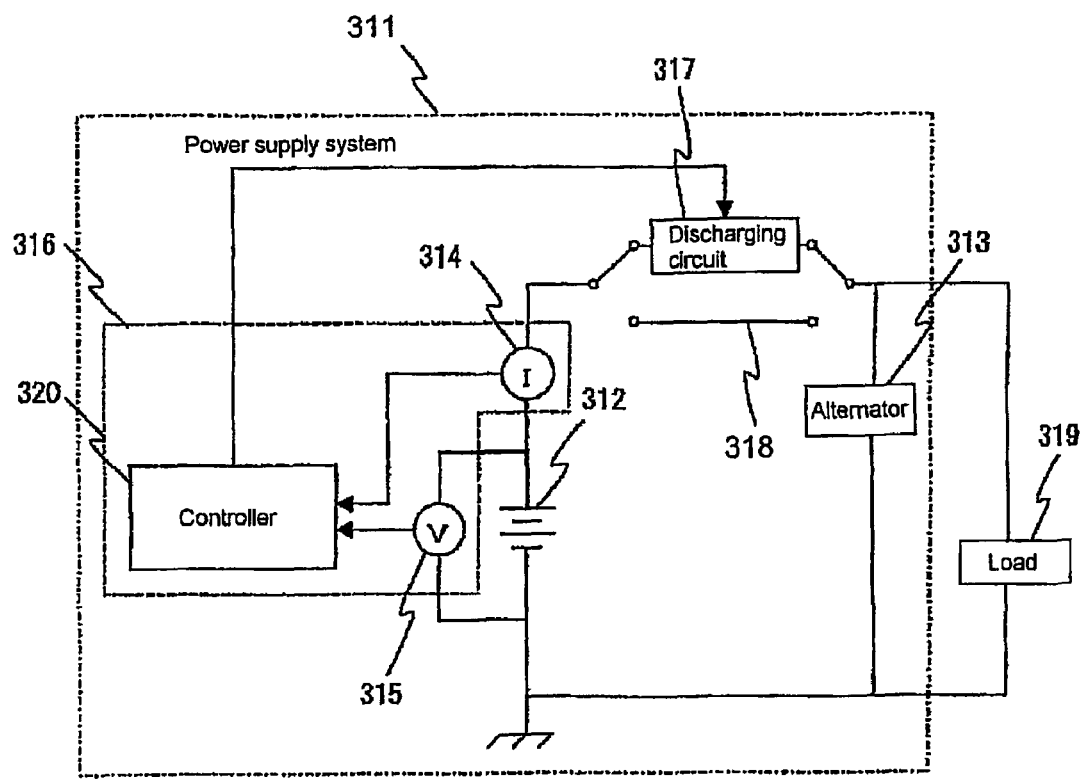
FIG. 15 is a block diagram illustrating a schematic configuration of a power supply system related to the fourth embodiment of the present invention.

FIG. 15 is a block diagram illustrating a schematic configuration of a power supply system according to the forth embodiment of the present invention. In FIG. 15, a power supply system 311 includes a battery 312 and an alternator 313 as a power supply. An estimation unit 316 for estimating at least one of the deterioration level and the discharge capability includes a current sensor 314 and a voltage sensor 315 for measuring a current and a voltage of the battery 312, respectively.

A control section 320 arranged in the estimation unit 316 for estimating at least one of the deterioration level and the discharge capability receives the measured current value and the measured voltage value from the current sensor 314 and the voltage sensor 315, respectively, and estimates the deterioration level or the discharge capability of the battery 312 by using the method for estimating the deterioration level or the discharge capability according to the present invention.

In order to estimate the deterioration level or the discharge capability of the battery 312, the power supply system 311 of this embodiment shown in FIG. 15 is configured such that the battery 312 is discharged or charged with a pulse current. More specifically, there is provided a discharging circuit 317 for discharging the battery 312 with the pulse current. When charging the battery 312 with the pulse current, the battery 312 can be charged by the alternator 313 through a line 318.

Figure 14:
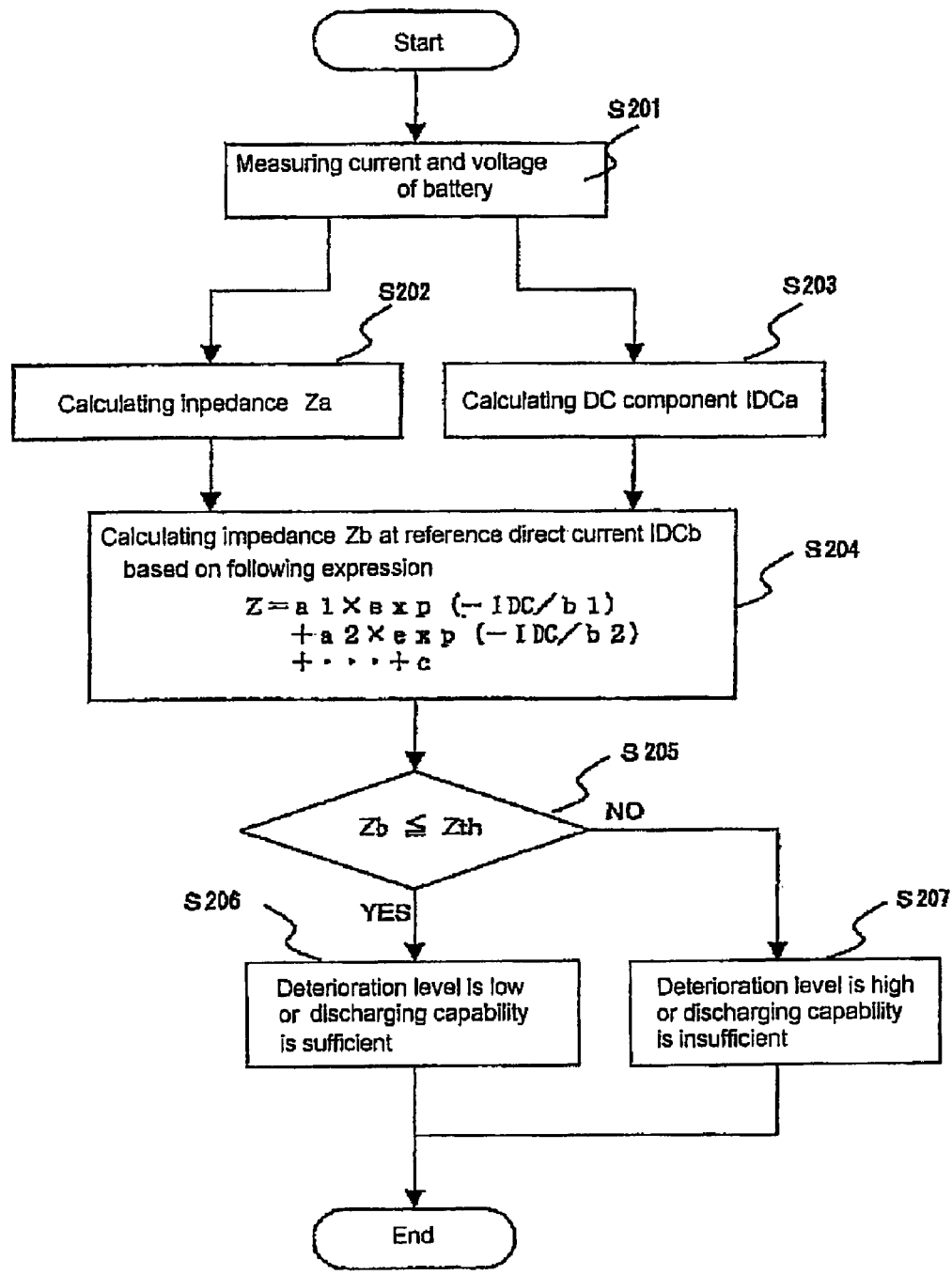
FIG. 14 is a flow chart for explaining one embodiment of a method for estimating a deterioration level or discharge capability of a battery according to the present invention.

The method for estimating the deterioration level or the discharge capability of the battery 312 executed by the control section 320 will be explained in detail below by using FIG. 14. FIG. 14 is a flow chart for explaining one embodiment of the method for estimating the deterioration level or the discharge capability of the battery according to the present invention.

In the embodiment shown in FIG. 14, first, at the step S201, the current and the voltage of the battery 312 are measured with the current sensor 314 and voltage sensor 315, respectively, and the measured current value and measured voltage value are input to the control section 320 from the respective sensor.

At the step S202, the impedance Za of the battery 312 is calculated based on the measured current value and the measured voltage value input at step S201. The impedance Za can be calculated by using, for example, the Fourier expansion each of the measured current value and the measured voltage value. Specifically, Fourier coefficients of the measured current value and the measured voltage value are respectively determined at a specified frequency and the impedance Za is calculated from these two coefficients.

At the step S203, the superimposed DC component IDCa is calculated based on the measured current value input at step S201. The DC component IDCa can be calculated by using, for example, the moving average of measured current values of a predetermined past time period from the measurement at S201. Alternatively, the DC component IDCa can be calculated by using the Kalman filter operation or the Fourier operation of the measured current value.

In the case of the Fourier operating of the measured current value, the constant term in the Fourier expansion represents the DC component IDCa. More specifically, the Fourier expansion of the measured current value is as follows:

$$I(t) = I0 + \Sigma Ian \times \cos(n\omega t) + \Sigma Ibn \times \sin(n\omega t) \quad (8)$$

It is found from the above expression (8) that the DC component IDCa is I0 (IDCa=I0).

At the step S204, the impedance Zb at a reference direct current IDCb value is calculated based on both of the impedance Za calculated at the step S202 and the DC component IDCa calculated at the step S203. Generally, since an impedance of a battery depends on the magnitude of DC of the battery, in this embodiment the impedance Zb at the reference direct current IDCb value is calculated from the impedance Za and the DC component IDCa at the time of measurement.

Figure 16:
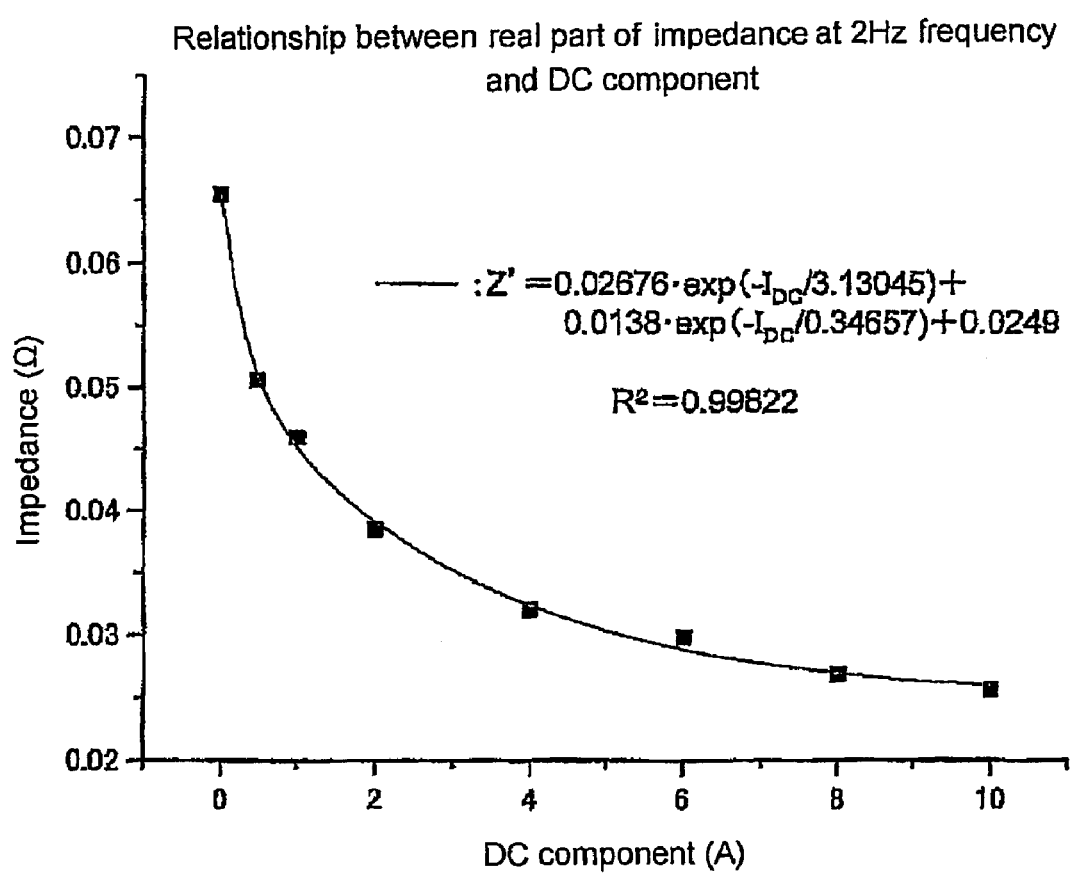
FIG. 16 is a graph showing one example of a real part of the impedance Za varying depending on the DC component IDCa.
Figure 17:
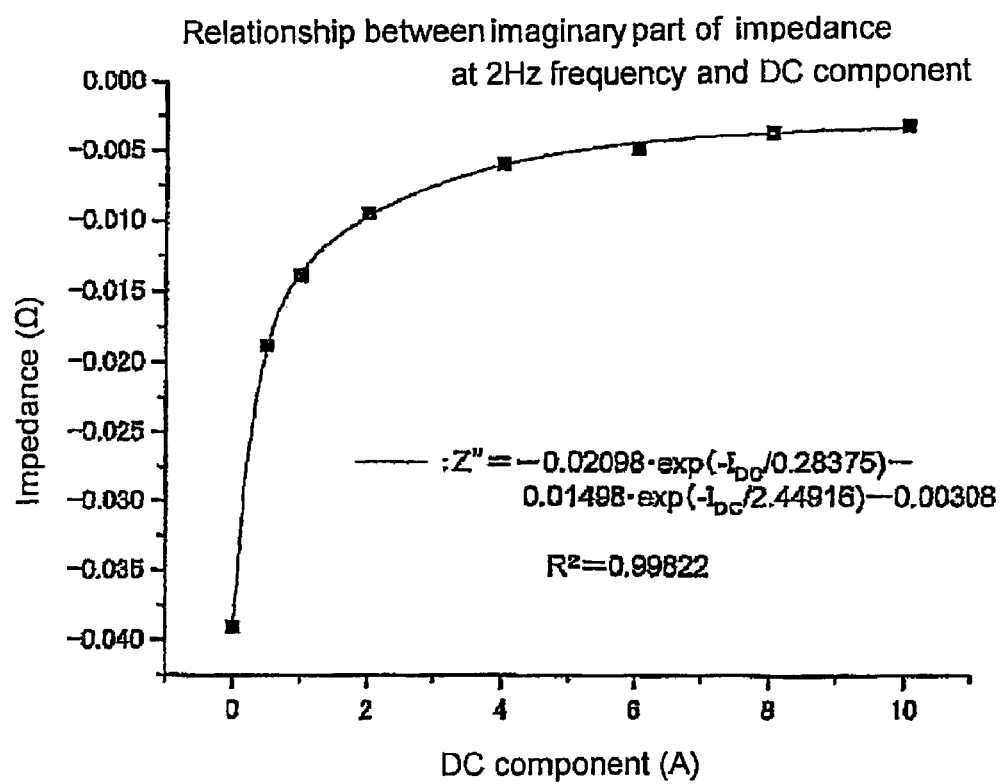
FIG. 17 is a graph showing one example of an imaginary part of the impedance Za varying depending on the DC component IDCa.

One example of the impedance Za of the battery 312 varying depending on the DC component IDCa is shown in FIG. 16 and FIG. 17. FIG. 16 and FIG. 17 show the impedance Za obtained from the Fourier expansion each of the measured current value and measured voltage value. Specifically, Fourier coefficients of the measured current value and the measured voltage value are respectively determined at 2 Hz frequency and the impedance Za is calculated from these two coefficients. A real part Z' of the impedance Za obtained as described above is shown in FIG. 16 and an imaginary part Z" of the impedance Za is shown in FIG. 17.

According to FIG. 16 and FIG. 17, it is recognizable that the impedance Za of the battery 312 varies greatly depending on the DC component IDCa. Especially, it is recognizable that both real and imaginary parts of the impedance vary greatly at the low DC component range. The relational expression between the direct current IDC and the impedance Z described above can be decided in a manner so as to agree with the variation of the impedance with respect to the DC component shown in FIG. 16 and FIG. 17.

As described above, in order to obtain the impedance Zb at the reference direct current IDCb value based on the impedance Za and the DC component IDCa at the time of measurement, the relational expression between the superimposed direct current IDC and the impedance Z is required. The relational expression is preferably constructed to have at least one exponential term of the superimposed direct current IDC, for example, as shown by the expression (7).

In the present embodiment, the relational expression (7) is used at the step S204. The values of the coefficients a1, a2 . . . , b1, b2, . . . in the expression (7) are decided so that, when substituting the DC component IDCa value calculated at the step S203 into the direct current IDC of the relational expression, the impedance Z of the left side agrees with the impedance Za calculated at the step S202.

After the coefficients being decided as described above, the impedance Zb corresponding to the reference direct current IDCb value can be calculated by substituting the reference direct current IDCb value into the expression (7) using the coefficients thus obtained.

At the step S205, the deterioration level or the discharge capability of the battery 312 is determined by comparing the impedance Zb corresponding to the reference direct current IDCb value calculated at the step S204 with the specified impedance allowable value (hereinafter referred as "Zth"). In other words, if the impedance Zb is judged as being equal to or less than the allowable value Zth, the battery 312 is determined as being that the deterioration level thereof is low or as being that the discharge capability thereof is sufficiently high (step S206).

On the other hand, at the step S205, if the impedance Zb is judged as exceeding the impedance allowable value Zth, the battery 312 is determined as being that the deterioration level thereof is high or as being that the discharge capability thereof is insufficient (S207). In this case, an alarm such as "Exchange of Battery" may be displayed.

According to the present embodiment as described above, the impedance Zb at the reference direct current IDCb value is calculated from the impedance Za and the DC component IDCa at the time of measurement and the impedance Zb at a reference direct current IDCb value is compared with the specified impedance allowable value, thus the deterioration level or the discharge capability of the battery 312 can be determined at the same condition of the fixed DC value. As a result, it becomes possible to accurately determine the deterioration level or the discharge capability of the battery 312.

Besides, since the relational expression between the superimposed direct current IDC and the impedance Z, which is required for obtaining the impedance Zb at the reference direct current IDCb value based on the impedance Za and the DC component IDCa at the time of measurement, includes at least one exponential term of the direct current IDC, for example as the expression (7), it is possible to determine the deterioration level or the discharge capability of the battery 312 with high accuracy.

In the above embodiment, the relational expression (7) is used as the relational expression between the superimposed direct current IDC and the impedance Z, and the values of the coefficients a1, a2, . . . , b1, b2, . . . are decided in such a manner that the DC component IDCa and the impedance Za at the time of measurement satisfy the expression (7). Alternatively, the values of each coefficient can be given by the functions $f1(c), f2(c), \ldots, g1(c), g2(c), \ldots$ of the adjustment parameter C so as to be able to uniquely decide the coefficients from the DC component IDCa and the impedance Za.

In the case where the coefficients a1, a2, . . . , b1, b2, of the relational expression (7) between the superimposed direct current IDC and the impedance Z are given by the functions $f1(c), f2(c), \ldots, g1(c), g2(c), \ldots$ of the adjustment parameter C, the adjustment parameter c is decided in such a manner that the expression (7) satisfy the DC component IDCa and the impedance Za.

Further, the functions $f1(c), f2(c), \ldots, g1(c), g2(c), \ldots$ of the adjustment parameter C can be made as a linear function of C, respectively. In this case, the adjustment parameter C may be analytically calculated from the DC component IDCa and the impedance Za.

The description of the present embodiment shows one example of a method for estimating a deterioration level or discharge capability of a battery according to the present invention, and the present invention is not limited to the embodiment. Detail configuration, detail operation, and the like of the method for estimating a deterioration level or discharge capability of a battery according to the embodiment may be modified as needed within the sprit and scope of the present invention.

This description is based on Japanese Patent Application No. 2005-270917 filed on Sep. 16, 2005 and Japanese Patent Application No. 2005-300333 filed on Oct. 14, 2005, and Japanese Patent Application No. 2006-007980 filed on Jan. 16, 2006. The entire contents thereof are incorporated herein.

The invention claimed is:

1. A method for determining SOH of a secondary battery according to an internal impedance or an internal resistance of the secondary battery supplying power to a load, comprising:

preparing in advance a specified temperature characteristic function which contains at least one exponential terms and one adjustment parameter and expresses a temperature dependency of the internal impedance or the internal resistance;

calculating the internal impedance or the internal resistance based on a measured current value or a measured voltage value at the time when the secondary battery is charged or discharged with a specified current;

determining a value of the adjustment parameter by substituting a measured temperature at the time when the secondary battery is charged or discharged with the specified current and the calculated internal impedance or the internal resistance to the temperature characteristic function;

calculating a reference internal impedance or a reference internal resistance by substituting the determined adjustment parameter value and a specified reference temperature into the temperature characteristic function; and determining, using a controller circuit, the SOH of the secondary battery based on the calculated reference internal impedance or the calculated reference internal resistance if the calculated reference internal impedance or the calculated reference internal resistance exceeds a threshold, and determining that the SOH is acceptable if the calculated reference internal impedance and the calculated reference internal resistance do not exceed the threshold.

2. The method of claim 1, wherein the temperature characteristic function is expressed by:

$$Z(\text{Temp}) \text{ or } R(\text{Temp}) = f(C) \times \exp\{g(C)/\text{Temp}\} + C$$

where Z is the internal impedance, R is the internal resistance, C is the adjustment parameter, and f and g express a specified function respectively.

3. The method of claim 1, further comprising:

setting in advance a first threshold for determining the SOH based on the reference internal impedance and a second threshold for determining the SOH based on the reference internal resistance, respectively;

judging which of the reference internal impedance and the first threshold is high when the reference internal impedance was calculated, and judging which of the reference internal resistance and the second threshold is high when the reference internal resistance was calculated; and determining the SOH of the secondary battery based on either of two judged results.

4. The method of claim 1, wherein the internal impedance is calculated based on the measured current value and the measured voltage value at the time when the secondary battery is charged or discharged at an AC of 100 Hz or more frequency as the specified current.

5. The method of claim 1, wherein the secondary battery is charged or discharged with a pulse current as the specified current, and the internal resistance is calculated based on measured values of the current and voltage measured within 10 ms of starting the charge or discharge.

6. An apparatus for determining an SOH of a secondary battery based on an internal impedance or an internal resistance of the secondary battery supplying power to a load, comprising:

a charging circuit for charging the secondary battery with a specified current;

a discharging circuit for discharging the secondary battery with a specified current;

a current sensor for measuring a current of the secondary battery;

a voltage sensor for measuring a voltage of the secondary battery;

a temperature sensor for measuring a temperature of the secondary battery; and a control unit configured to: (i) receive a measured current value, a measured voltage value, and a measured temperature value from the current sensor, the voltage sensor, and the temperature sensor, respectively, at the time when the secondary battery is charged or discharged with the specified current by the charging circuit or the discharging circuit; (ii) calculate the internal impedance or the internal resistance based on the measured current value and the measured voltage value; (iii) determine a value of an adjustment parameter by substituting the calculated internal impedance or the calculated internal resistance and the measured temperature into a temperature characteristic function which contains at least one exponential terms and one adjustment parameter and expresses a temperature dependency of the internal impedance or the internal resistance; (iv) calculate a reference internal impedance or a reference internal resistance by substituting the decided adjustment parameter value and a specified reference temperature into the temperature characteristic function; and (v) determine an SOH of the secondary battery based on the calculated reference internal impedance or the calculated reference internal resistance.

7. The apparatus of claim 6, further comprising:
a storage unit storing in advance a first threshold for determining deterioration based on the reference internal impedance, and a second threshold for determining deterioration based on the reference internal resistance, wherein the control unit compares the reference internal impedance and the first threshold read out from the storage unit when the reference internal impedance was calculated, compares the reference internal resistance and the second threshold read out from the storage unit when the reference internal resistance was calculated, and determines the SOH of the secondary battery based on either of two comparison results.

8. The apparatus of claim 7, wherein the storage unit stores a charge or discharge selection signal to select either the charge or the discharge of the secondary battery with the specified current, and the control unit reads the charge or discharge selection signal from the storage unit and outputs a specified instruction signal to the charging circuit or the discharging circuit based on the charge or discharge selection signal.

9. The apparatus of claim 7 or claim 8, wherein the storage unit stores a DC or AC selection signal to designate either an AC of 100 Hz or more frequency or a pulse current as the specified current, and the control unit reads the DC or AC selection signal from the storage unit and selects either the AC of 100 Hz or more frequency or the pulse current in accordance with the DC or AC selection signal so as to output a specified control signal to the charging circuit or the discharging circuit.

10. The apparatus of claim 9, wherein the storage unit stores at least one of a frequency of the AC and a pulse width of the pulse current, and the control unit reads at least one of the frequency of the AC and the pulse width of the pulse current from the storage unit and sets at least one of the frequency of the AC and the pulse width of the pulse current in the charging circuit or the discharging circuit at the same time as or prior to the output of the specified control signal for the charging circuit or the discharging circuit.

11. A power supply system comprising the apparatus for determining an SOH of a secondary battery according to claim 7.

12. The power supply system of claim 11, further comprising:
a display unit for displaying a determination result of the SOH of the secondary battery by receiving the result from the apparatus for determining an SOH of a secondary battery.

13. The power supply system of claim 11 or claim 12, further comprising:
an input unit for changing data stored in the storage unit, wherein at least one or all of the first threshold for the determining, the second threshold for the determining, the charge or discharge selection signal, the DC or AC selection signal, the frequency of the AC, and the pulse width of the pulse current can be changed with the input unit.

14. A method for determining SOH of a secondary battery according to an internal impedance or an internal resistance of the secondary battery supplying power to a load, comprising:
preparing in advance a specified temperature characteristic function which contains at least one exponential terms and expresses a temperature dependency of the internal impedance or the internal resistance;
calculating the internal impedance or the internal resistance based on a measured current value or a measured voltage value at the time when the secondary battery is charged or discharged with a specified current;
transforming the calculated internal impedance or the internal resistance into a index of the SOH using the temperature characteristic function; and
determining, using a controller circuit, the SOH of the secondary battery based on the index if the index exceeds a threshold, and determining that the SOH is acceptable if the index does not exceed the threshold.

* * * * *